United States Patent
Ohsawa

(10) Patent No.: US 7,499,331 B2
(45) Date of Patent: Mar. 3, 2009

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 11/640,291

(22) Filed: Dec. 18, 2006

(65) Prior Publication Data

US 2007/0189094 A1 Aug. 16, 2007

(30) Foreign Application Priority Data

Feb. 16, 2006 (JP) ............................. 2006-039531

(51) Int. Cl.
*G11C 11/34* (2006.01)
(52) U.S. Cl. .................. 365/185.2; 365/210.1; 365/177
(58) Field of Classification Search .................. 365/177, 365/210, 174, 185.2, 210.1; 257/347, 348
See application file for complete search history.

(56) References Cited

U.S. PATENT DOCUMENTS

| | | | |
|---|---|---|---|
| 5,770,881 A * | 6/1998 | Pelella et al. ................ | 257/347 |
| 6,617,651 B2 | 9/2003 | Ohsawa | |
| 6,621,725 B2 | 9/2003 | Ohsawa | |
| 6,687,152 B2 | 2/2004 | Ohsawa | |
| 2005/0167751 A1* | 8/2005 | Nakajima et al. ............ | 257/347 |
| 2006/0092699 A1* | 5/2006 | Higashi et al. ............... | 365/177 |
| 2008/0144367 A1* | 6/2008 | Dreesen et al. .............. | 365/182 |

OTHER PUBLICATIONS

S. Okhonin, et al., "Principles of Transient Charge Pumping on Partially Depleted SOI MOSFETs", IEEE Electron Device Letters, vol. 23, No. 5, pp. 279-281, May 2002.

* cited by examiner

*Primary Examiner*—VanThu Nguyen
*Assistant Examiner*—Han Yang
(74) *Attorney, Agent, or Firm*—Finnegan, Henderson, Farabow, Garrett & Dunner, L.L.P.

(57) ABSTRACT

A semiconductor memory device including a memory cell including a floating body in an electrically floating state and storing therein data according to number of a plurality of majority carriers accumulated in the floating body; a dummy cell generating a reference signal based on which the data stored in the memory cell is detected; a word line connected to a gate of the memory cell; a dummy word line connected to a gate of the dummy cell; a bit line connected to a source or a drain of the memory cell and a source or a drain of the dummy cell; and a diffused layer adjacent to the source or the drain of the dummy cell, the diffused layer being equal in conduction type to the floating body of the dummy cell, wherein the floating body of the dummy cell, the source or the drain of the dummy cell, and the diffused layer constitute a bipolar transistor.

9 Claims, 19 Drawing Sheets

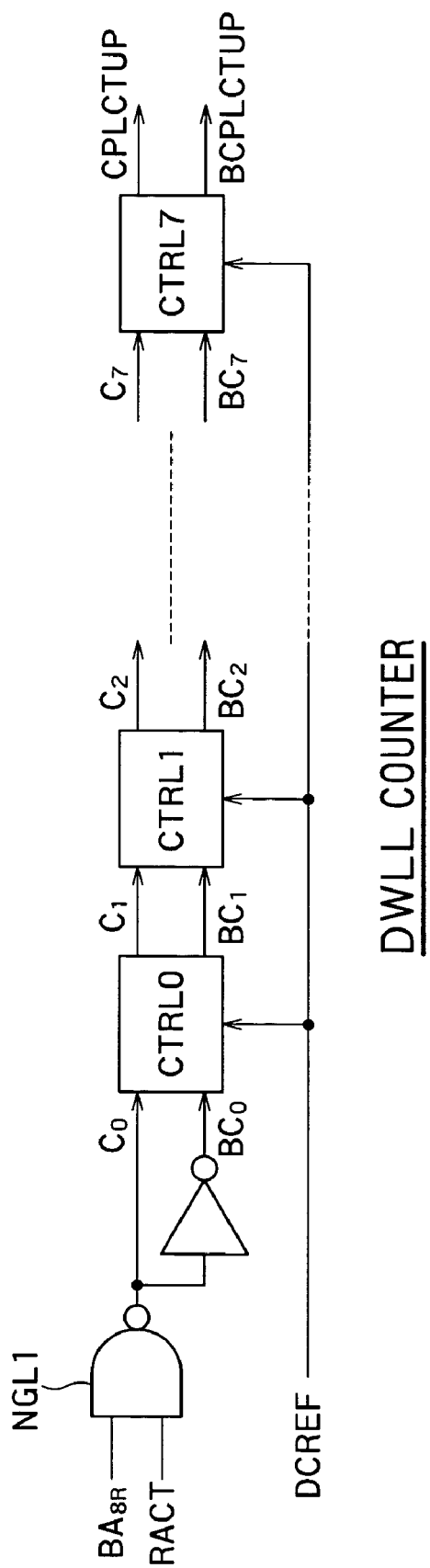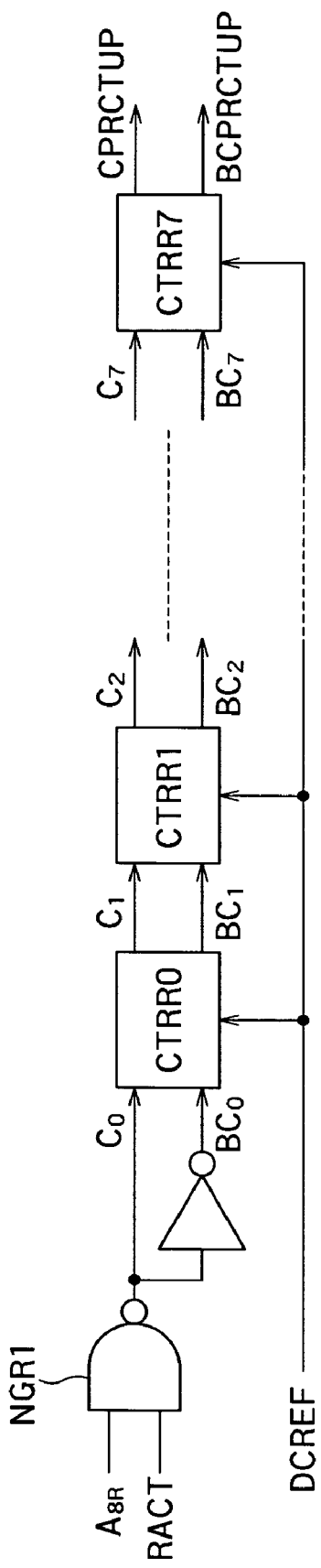
FIG. 5A  DWLL COUNTER
FIG. 5B  DWLR COUNTER

COUNTER CTRLi, CTRRi

CPL CONTROLLER

CPR CONTROLLER

DATA READING OPERATION

DATA WRITING OPERATION

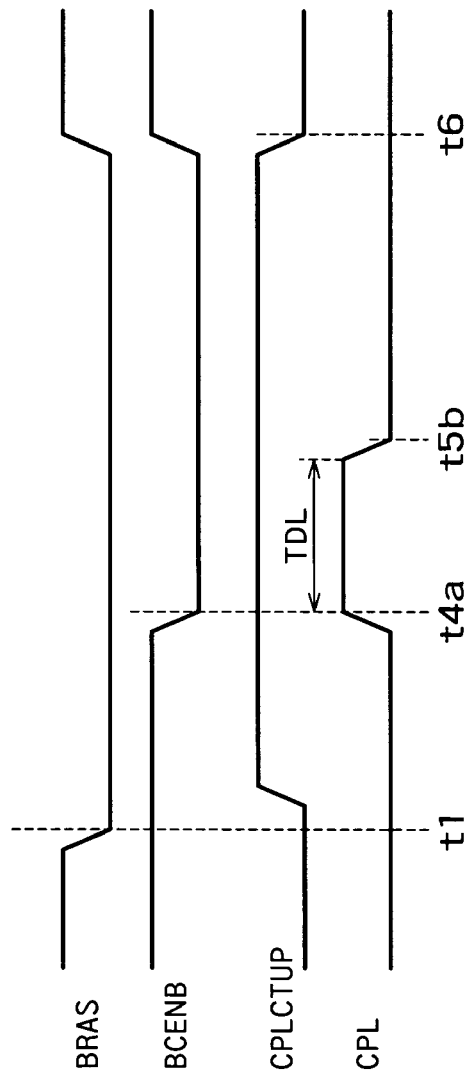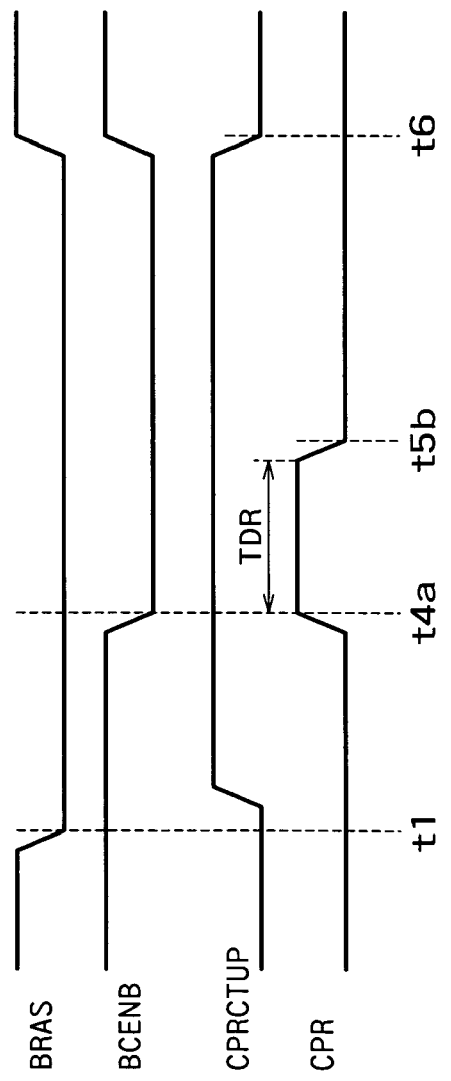

SEMICONDUCTOR MEMORY DEVICE

CROSS-REFERENCE TO RELATED APPLICATION

This application is based upon and claims the benefit of priority from the prior Japanese Patent Applications No. 2006-39531, filed on Feb. 16, 2006, the entire contents of which are incorporated herein by reference.

BACKGROUND OF THE INVENTION

1. Field of the Invention

The present invention relates to a semiconductor memory device, for example, a floating-body-cell (FBC) memory device that stores information by accumulating majority carriers in a floating body of a field-effect transistor (FET).

2. Related Art

Recently, an FBC memory device is expected as a semiconductor memory device that replaces a dynamic random-access memory (DRAM). The FBC memory device is configured as follows. An FBC memory cell constituted by an FET including a floating body (hereinafter, also "body region") is formed on a silicon-on insulator (SOI) substrate. The FBC memory cell stores therein data "1" or "0" according to the number of carriers accumulated in the body region.

The FBC memory constituted by the FET has a problem of charge pumping phenomenon (see Non-Patent Document 1). If the FBC memory cell is an n-type FET, parts of electrons in an inversion layer are trapped by an interface state on an interface between a gate oxide film and the body region when the FBC memory cell is turned on. The holes accumulated in the body region are recombined with the electrons and disappear. If a word line is activated between a refresh operation and a next refresh operation, data is not written back to an unselected FBC memory cell. Due to this, if the unselected memory cell is repeatedly turned on and off during reading or writing of the data from or to a selected memory cell, the number of holes accumulated in the body region of the unselected memory cell that stores the data "1" therein gradually decreases. As a result, the data "1" in the unselected memory cell is changed to data "0".

Accordingly, the FBC memory device is not a destructive read-out cell differently from the DRAM, but is not a complete non-destructive read-out cell. In other words, it has been made clear that the FBC memory device is a quasi non-destructive read-out cell.

The charge pumping phenomenon influences not only ordinary memory cells but also dummy cells. The influence of the charge pumping phenomenon on the dummy cell is rather greater than that on the ordinary memory cell because the number of times of reading data from the dummy cell is larger than that of reading data from the ordinary memory cell.

Conventionally, the charge pumping phenomenon influencing the dummy cell is dealt with by providing an FET to which the data "1" is written for every other bit line. However, if the FET is provided for every other bit line, a circuit scale is disadvantageously made large and a chip size of the memory device is disadvantageously increased.

SUMMARY OF THE INVENTION

A semiconductor memory device according to an embodiment of the present invention comprises a memory cell including a floating body in an electrically floating state and storing therein data according to number of a plurality of majority carriers accumulated in the floating body; a dummy cell generating a reference signal based on which the data stored in the memory cell is detected; a word line connected to a gate of the memory cell; a dummy word line connected to a gate of the dummy cell; a bit line connected to a source or a drain of the memory cell and a source or a drain of the dummy cell; and a diffused layer adjacent to the source or the drain of the dummy cell, the diffused layer being equal in conduction type to the floating body of the dummy cell, wherein the floating body of the dummy cell, the source or the drain of the dummy cell, and the diffused layer constitute a bipolar transistor.

BRIEF DESCRIPTION OF THE DRAWINGS

FIG. 5A is a circuit diagram of the DWLL counter;

FIG. 5B is a circuit diagram of the DWLR counter;

FIG. 13A is a timing chart of the signals BCENB, CPLCTUP, and CPL input or output to or from the CPL controller shown in FIG. 7A during the temporary refresh operation performed on the dummy cell DC;

FIG. 13B is a timing chart of the signals BCENB, CPRCTUP, and CPR input or output to or from the CPR controller shown in FIG. 7B during the temporary refresh operation performed on the dummy cell DC;

DETAILED DESCRIPTION OF THE INVENTION

Hereafter, embodiments of the present invention will be described with reference to the drawings. Note that the invention is not limited to the embodiments.

First Embodiment

Figure 1:
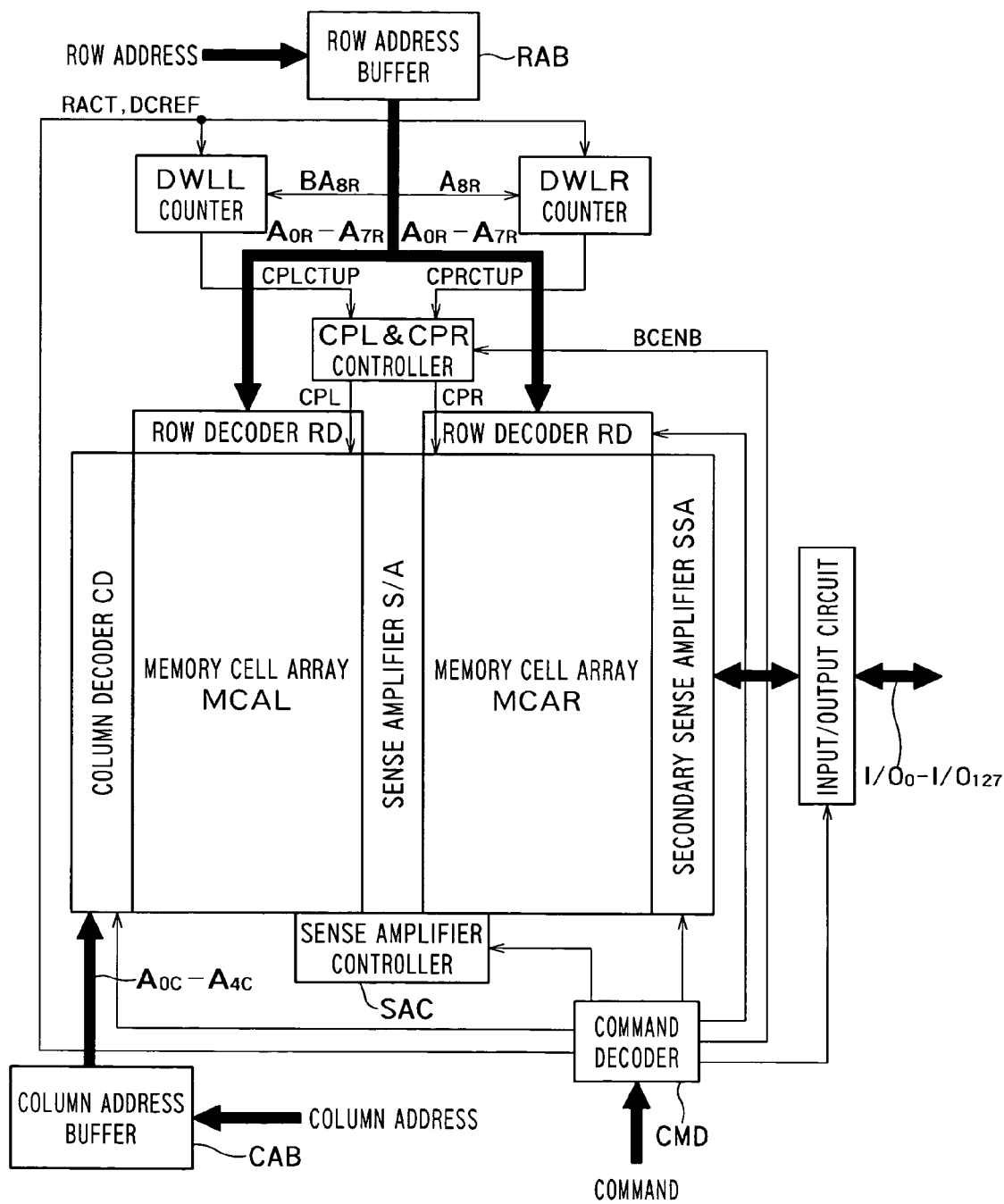
FIG. 1 is a block diagram of an FBC memory device according to a first embodiment of the present invention.

FIG. 1 is a block diagram of an FBC memory device according to a first embodiment of the present invention. The FBC memory device includes a sense amplifier S/A and memory cell arrays MCAL and MCAR (hereinafter, also "MCA") provided on both sides of the sense amplifier S/A, respectively. A row decoder RD selects a word line of the memory cell array MCA, and a column decoder CD selects a bit line of the memory cell array MCA. A row address buffer RAB receives a row address from an outside of the FBC memory device, temporarily stores therein the row address, and outputs the row address to the row decoder RD. A column address buffer CAB receives a column address from the outside of the FBC memory device, temporarily stores therein the column address, and outputs the column address to the column decoder CD. A sense amplifier controller SAC controls the sense amplifier S/A. A command decoder CMD controls respective constituent elements of the FBC memory device in response to an external command.

The FBC memory device according to the present embodiment also includes a DWLL counter, a DWLR counter, a CPL&CPR controller, a secondary sense amplifier SSA, and an input/output circuit. The DWLL counter and the DWLR counter count the number of times of activating a dummy word line in the memory cell arrays MCAL and MCAR, respectively. The CPL&CPR controller detects that the number of times of activating the dummy word line reaches a predetermined value. In addition, the CPL&CPR controller outputs a signal CPL or CLR to the corresponding memory cell array MCAL or MCAR, respectively, to supply majority carriers to a floating body of a dummy cell DC. The number of times of activation means the number of times of applying a potential to a gate of the dummy cell DC through the dummy word line to generate a reference potential when data is read from a memory cell MC, when data is written to the memory cell MC, or when the data stored in the memory cell MC is refreshed. A refresh operation means an operation of temporarily reading data from the memory cell MC or the dummy cell DC, and restoring the same data as the read data in the same memory cell MC or the same dummy cell DC. Furthermore, the reference potential is an intermediate potential between a potential of a bit line for transmitting data "1" and that of a bit line for storing data "0". The data "1" or "0" is detected based on the reference potential. The signals CPL and CPR are signals for indicating a refresh operation to be performed on dummy cells DCL and DCR, respectively.

In the present embodiment, row addresses A8R and BA8R are row address signals for selecting one of the memory cell arrays MCAL and MCAR. The DWLL counter and the DWLR counter count the number of times of activating the row addresses BA8R and A8R, respectively. When the row address A8R is active (HIGH (high level)), the sense amplifier S/A receives the reference potential from a dummy cell in the memory cell array MCAR, and reads data from a memory cell in the memory cell array MCAL. At this time, a dummy word line in the memory cell array MCAR is activated. Therefore, the DWLR counter can be informed of the number of times of activating the dummy word line in the memory cell array MCAR by counting the number of times of activating the row address A8R. When the number of times of activating the dummy word line in the memory cell array MCAR reaches the predetermined value, the DWLR counter outputs a signal CPRCTUP to the CPL&CPR controller to deal with the charge pumping phenomenon.

When the row address BA8R is active (HIGH), the sense amplifier S/A receives the reference potential from a dummy cell in the memory cell array MCAL, and reads data from a memory cell in the memory cell array MCAR. At this time, a dummy word line in the memory cell array MCAL is activated. Therefore, the DWLL counter can be informed of the number of times of activating the dummy word line in the memory cell array MCAL by counting the number of times of activating the row address BA8R. When the number of times of activating the dummy word line in the memory cell array MCAL reaches the predetermined value, the DWLL counter outputs a signal CPLCTUP to the CPL&CPR controller to deal with the charge pumping phenomenon.

It is to be noted that eight row addresses A0R to A7R are row address signals for selecting a word line. In the present embodiment, the row address signals A0R to A7R are eight bits, so that one of 256 word lines can be selected.

When the CPL&CPR controller receives the signal CPRCTUP, the CPL&CPR controller transmits a signal CPR to the memory cell array MCAR at timing at which a signal BCENB from the command decoder CMD is activated. When receiving the signal CPLCTUP, the CPL&CPR controller transmits a signal CPL to the memory cell array MCAL at timing at which the signal BCENB from the command decoder CMD is activated.

Figure 2:
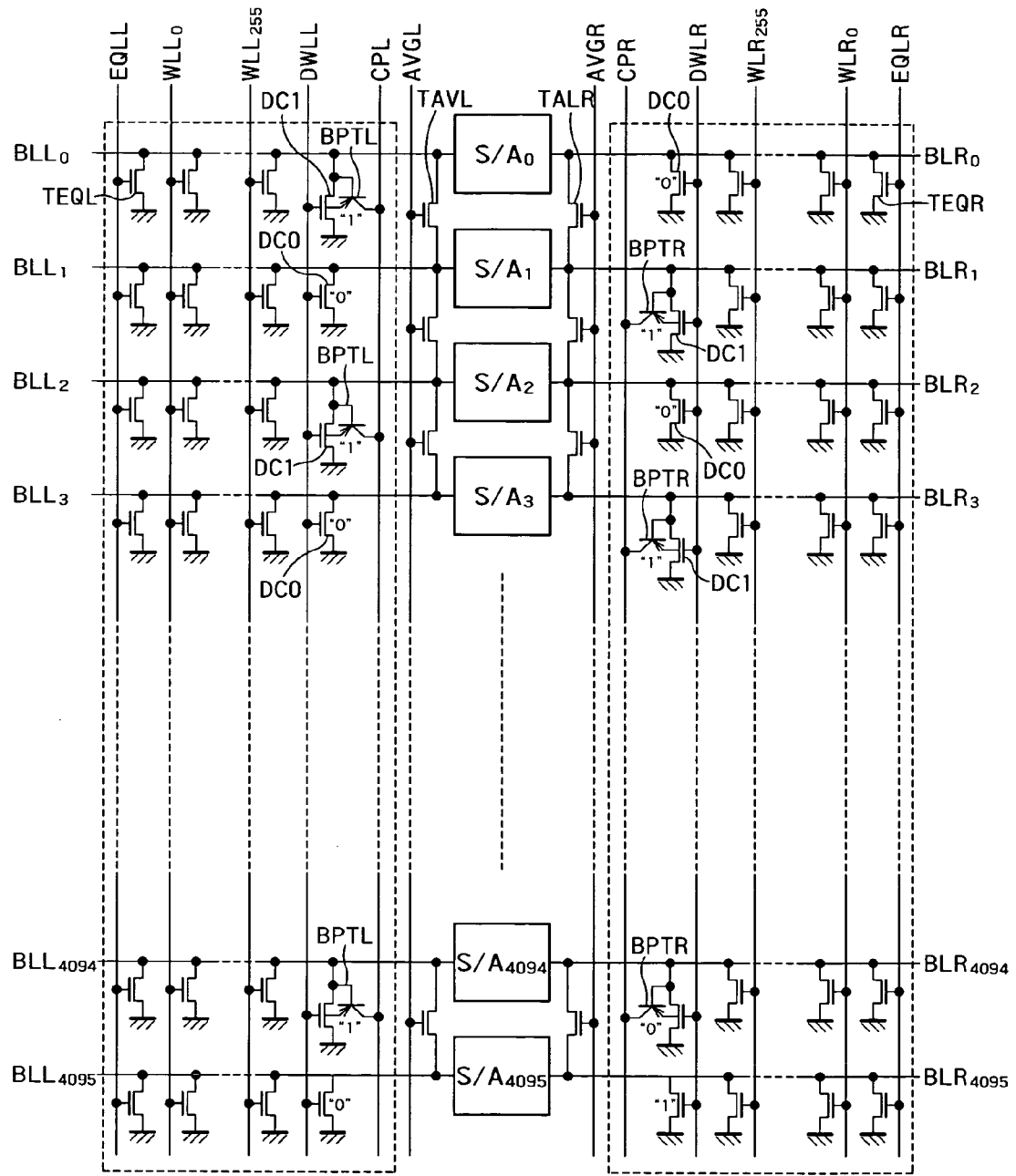
FIG. 2 is a circuit diagram of an internal configuration of the memory cell arrays MCAL and MCAR.

FIG. 2 is a circuit diagram of an internal configuration of the memory cell arrays MCAL and MCAR. The FBC memory device 100 includes memory cells MCs, first dummy cells DC0, second dummy cells DC1, word lines WLLi and WLRi (where i is an integer) (hereinafter, also "WL"), dummy word lines DWLL and DWLR (hereinafter, also "DWL"), bit lines BLLi and BLRi (hereinafter, also "BL"), sense amplifiers S/Ai (hereinafter, also "S/A"), equalizing lines EQLL and EQLR (hereinafter, also "EQL"), equalizing transistors TEQL and TEQR (hereinafter, also "TEQ"), averaging lines AVGL and AVGR (hereinafter, also "AVG"), averaging transistors TAVL and TAVR (hereinafter, also "TAV"), and bipolar transistors BPTL and BPTR.

The memory cells MCs are arranged in a matrix and constitute the memory cell array MCAL or MCAR (hereinafter, also "MCA"). Each of the word lines WL extends in a row direction and is connected to a gate of each memory cell MC. 256 word lines WL are provided on each of the left and right of sense amplifier S/A. In FIG. 2, the 256 word lines WL on the right of the sense amplifiers S/A are denoted by WLL0 to WLL255 and those on the left are denoted by WLR0 to WLR255, respectively. Each of the bit lines BL extends in a column direction and is connected to a source or a drain of each memory cell MC. 4096 bit lines BL are provided on each of the left and right of the sense amplifier S/A. In FIG. 2, the 4096 bit lines BL on the right of the sense amplifiers S/A are denoted by BLL0 to BLL4095 and those on the left are denoted by BLR0 to BLR4095, respectively. The word lines WL and the bit lines BL are orthogonal to one another and the memory cells MC are provided at respective points of intersection between the word lines WL and the bit lines BL. The memory cells MC are also referred to as "a cross-point cell structure". It is to be noted that the row direction and the column direction may be replaced by each other.

Prior to an operation of reading or writing data, the dummy cells DC0 and DC1 store therein data "0" and "1" opposite in polarity, respectively. Normally, the data is written to the dummy cells DC0 and DC1 right after the FBC memory device is powered on. The polarity indicates a logic value "1" or "0" of the data. The dummy cells DC0 and DC1 are used to generate a reference current Iref when data of the memory cell MC is detected. The reference current Iref is substantially an intermediate current between a current which flows a memory cell storing the data "0" and a current which flows a memory cell storing the data "1". The reference current Iref is applied from a current mirror to the memory cell MC, and the data of the memory cell MC is transmitted to a sense node within each sense amplifier S/A. The sense amplifier S/A discriminates whether the logic value of the data is "0" or "1" depending on a potential of the sense node.

The dummy cells DC0 and DC1 are alternately arranged in an extension direction of the word lines WL (the column direction). Furthermore, the dummy cells DC0 and DC1 opposite in polarity are provided on the left and right of a certain sense amplifier S/A, respectively. The dummy cells DC0 are as many as the dummy cells DC1.

Each of dummy word lines DWL extends in the row direction and is connected to a gate of each dummy cell DC. The dummy word lines DWL is provided on each of the left and right of the sense amplifier S/A. In FIG. 2, the dummy word line DWL on the left of the sense amplifier S/A is denoted by DWLL and that on the right is denoted by DWLR.

The bipolar transistors BPTL and BPTR are provided between the dummy cell DC1 and a CPL signal line and between the dummy cell DC1 and a CPR signal line, respectively. Each of the bipolar transistors BPTL and BPTR (hereinafter, also "BPT") includes a collector that is a body of the dummy cell DC1, a base that is a drain (or a source) of the dummy cell DC1, and an emitter that is a diffused layer 80 against the charge pumping phenomenon (hereinafter, "CP diffused layer 80") connected to the signal line CPL or CPR. The bipolar transistor BPT is provided for the first dummy cell DC1 that stores therein the data "1" and not provided for the second dummy cell DC0 that stores therein the data "0" for the following reasons. The charge pumping phenomenon is a phenomenon that the data "1" is changed to the data "0" due to disappearance of the holes from the body. The charge pumping phenomenon does not occur to the dummy cell DC0 that stores therein the data "0". A detailed configuration of each of the bipolar transistors BPTL and BPTR will be explained later.

The equalizing line EQL is connected to a gate of the equalizing transistor TEQ. The equalizing transistor TEQ is connected between the bit line BL and a ground. The equalizing transistor TEQ equalizes a potential of the bit line BL to a ground potential by connecting the bit line BL to the ground.

The averaging line AVG is connected to a gate of the averaging transistor TAV. The averaging transistor TAV is connected between the two adjacent bit lines BL. The averaging transistor TAV averages currents applied to the dummy cells DC0 and DC1 by generating a short-circuit between the dummy cells DC0 and DC1 during reading of the data. The reference current Iref is thereby generated.

Figure 3:
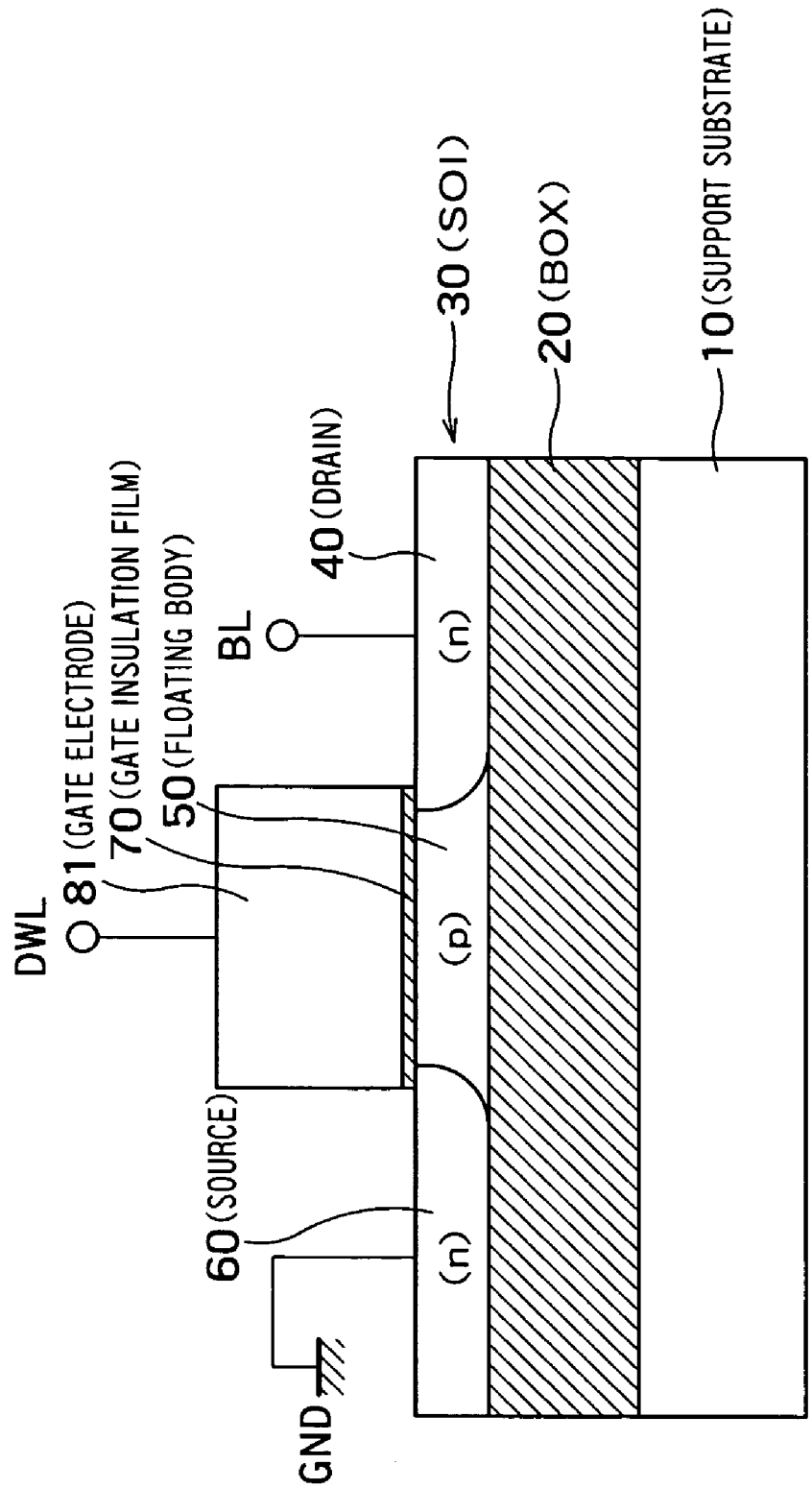
FIG. 3 is a cross-sectional view of each of the memory cell MC and the dummy cell DC.

FIG. 3 is a cross-sectional view of each of the memory cell MC and the dummy cell DC. It is to be noted that the dummy cell DC is equal in configuration to the memory cell MC. The memory cell MC is provided on an SOI substrate that includes a support substrate 10, a buried oxide (BOX) layer 20, and an SOI layer 30. A source 60 and a drain 40 are provided in the SOI layer 30. A floating body 50 is formed in the SOI layer 30 between the source 60 and the drain 40. The floating body 50 is a semiconductor opposite in conduction type to the source 60 and the drain 40 or is an intrinsic semiconductor. In the present embodiment, the memory cell MC is an n-type FET. The floating body 50 is in an electrically floating state by being surrounded by the source 60, the drain 40, the BOX layer 20, a gate insulating film 70, and a shallow trench isolation (STI) region (not shown). A gate electrode 81 is provided on the gate insulating film 70. The FBC memory device can store data according to the number of majority carries accumulated in the floating body 50 of each memory cell MC.

It is assumed, for example, that the memory cell MC is an n-type MISFET. It is also defined that a state in which more holes are accumulated in the floating body 50 is a state of the data "1", and that a state in which fewer holes are accumulated in the floating body 50 is a state of the data "0".

To write the data "1" to the memory cell MC, the memory cell MC is made to operate in a saturation state. For instance, the word line WL is biased to 1.5 volts and the bit line BL is biased to 1.5 volts. The source 60 is grounded (a potential of the source 60 is GND (0 volt)). By doing so, impact ionization occurs near the drain 40, and many pairs of electrons and holes are generated. The electrons generated by the impact ionization are carried to the drain 40 whereas the holes are accumulated in the floating body 50 having a low potential. When a current applied during generation of the holes by the impact ionization becomes equal to a forward current at a pn junction between the floating body 50 and the source 60, a body voltage turns into an equilibrium state. The body voltage in the equilibrium state is about 0.7 volt.

When the data "0" is written to the memory cell MC, a potential of the bit line BL is reduced to a negative voltage. The potential of the bit line BL is reduced to, for example, −1.5 volt. The pn junction between the floating body 50 and the drain 40 is greatly biased in a forward direction by the operation of reducing the potential of the bit line BL to the negative voltage. The holes accumulated in the floating body 50 are emitted to the drain 40, and the data "0" is stored in the memory cell MC.

In a data read operation, the word line WL is activated similarly to the data write operation but the potential of the bit line BL is set lower than that during writing of the data "1". For instance, the potential of the word line WL is set to 1.5 volts and that of the bit line BL is set to 0.2 volt. The memory cell MC is made to operate in a linear area. The memory cell MC that stores therein the data "0" differs in threshold voltage from the memory cell MC that stores therein the data "1" due to the difference in the number of holes accumulated in the floating body 50. By detecting the difference in threshold voltage between the memory cells MC, it is discriminated whether the data is "1" or "0". The reason for setting the potential of the bit line BL to the low voltage during the data read operation is as follows. If the potential of the bit line BL is set high and the memory cell MC is biased to the saturation state, the data "0" is changed to the data "1" by the impact ionization when the data "0" is read from the memory cell MC.

Figure 4:
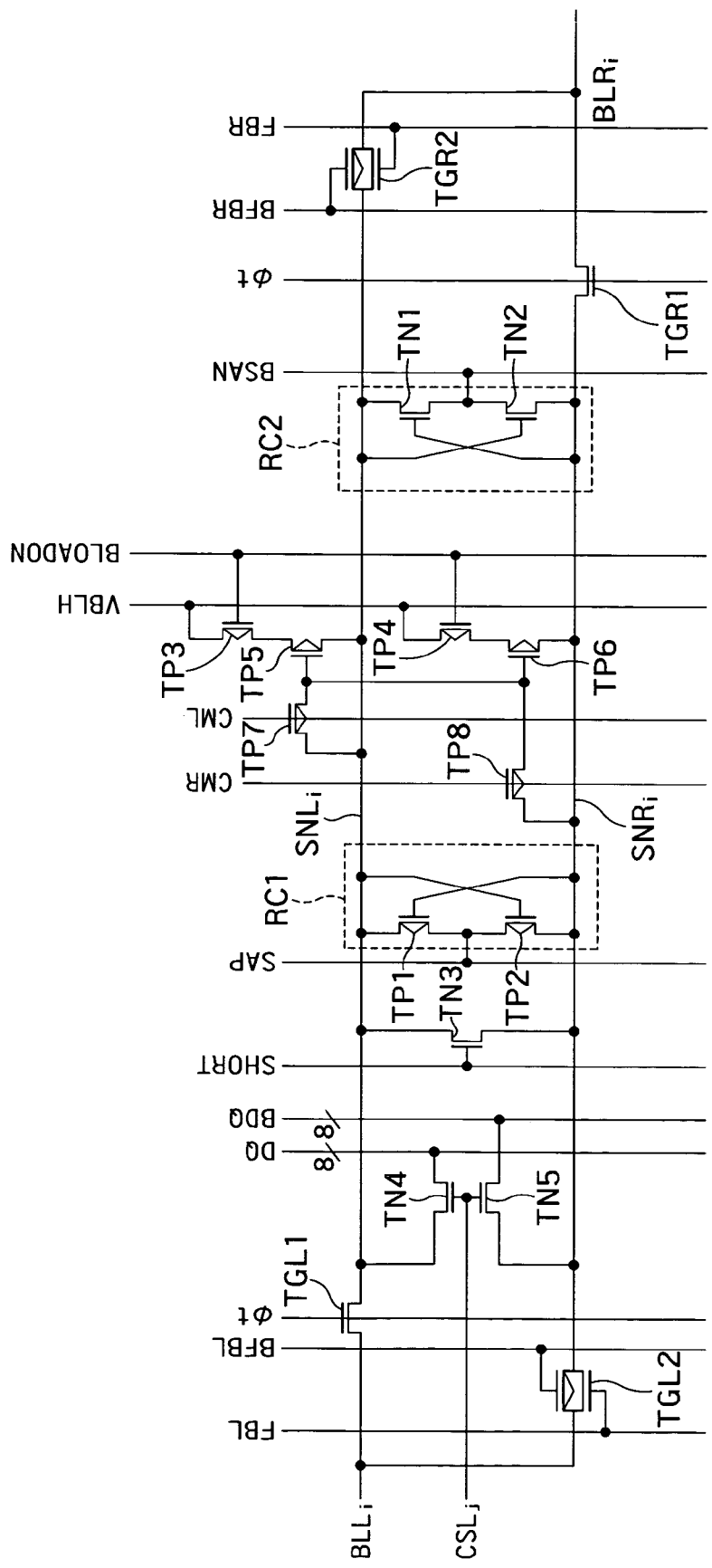
FIG. 4 is a circuit diagram of the sense amplifier S/Ai.

FIG. 4 is a circuit diagram of the sense amplifier S/Ai. The sense amplifier S/A is connected to the bit lines BLLi and BLRi provided on the left and right of the sense amplifier S/A, respectively, and provided to correspond to the paired bit lines BLLi and BLRi. As can be seen, the memory cell MC has an open bit line configuration in the present embodiment. Due to this, when the data is read from the memory cell MC, one of the paired bit lines BLLi and BLRi transmits the data and the other bit line transmits the reference potential Vref corresponding to Iref.

The sense amplifier S/A includes a pair of sense nodes SNLi (hereinafter, also "SNL") and SNRi (hereinafter, also "SNR"). The sense node SNL is connected to the bit line BLL through a transfer gate TGL1, and to the bit line BLR through a transfer gate TGR2. The sense node SNR is connected to the bit line BLL through a transfer gate TGL2 and to the bit line BLR through a transfer gate TGR1.

The transfer gates TGL1 and TGR1 are controlled to be turned on or off by a signal Φt. The transfer gates TGL2 is controlled to be turned on or off by signals FBL and BFBL. The transfer gates TGR2 is controlled to be turned on or off by signals FBR and BFBR.

For instance, if the data "1" on the bit line BLL is detected, then the threshold voltage of the N-type memory cell MC is lower than the reference potential Vref, and a potential of the sense node SNL is, therefore, lower than that of the sense node SNR. In the refresh operation, it is necessary to apply a high potential to the bit line BLL to write back the data "1" to the memory cell MC. Therefore, the sense node SNR having the high potential is connected to the bit line BLL by turning on the transfer gate TGL2.

The sense amplifier S/A also includes a cross-coupled dynamic latch circuit (hereinafter, "latch circuit") RC1 and RC2. The latch circuit RC1 includes two p-type transistors TP1 and TP2 connected in series between the sense nodes SNL and SNR. A gate of the transistor TP1 is connected to the sense node SNR, and a gate of the transistor TP2 is connected to the sense node SNL. Namely, the gates of the transistors TP1 and TP2 are cross-coupled with the sense nodes SNR and SNL, respectively. The latch circuit RC2 includes two n-type transistors TN1 and TN2 connected in series between the sense nodes SNL and SNR. A gate of the transistor TN1 is connected to the sense node SNR, and a gate of the transistor TN2 is connected to the sense node SNL. Namely, the gates of the transistors TP1 and TP2 are cross-coupled with the sense nodes SNR and SNL, respectively. The latch circuits RC1 and RC2 are driven by activating signals SAP and BSAN, respectively.

The sense amplifier S/A further includes P-type transistors TP3 to TP8 between the latch circuits RC1 and RC2. The transistors TP3 to TP8 constitute a current-mirror-type current load circuit and are configured to apply the same currents as those applied to the sense nodes SNL and SNR. The transistors TP3 and TP4 are controlled by a load signal BLOADON and function as a switching element that switches over between a power supply VBLH and the current mirror. The VBLH indicates the high potential applied to the bit line BL when the data "1" is written to the memory cell MC. The transistors TP7 and TP8 are controlled by signals CML and CMR, respectively, and connect gates of the transistors TP5 and TP6 to the sense nodes SNL and SNR, respectively. The transistors TP5 and TP6 can thereby apply the same current Iref based on the reference potential Vref equally to the sense nodes SNL and SNR.

The n-type transistor TN3 is connected between the sense nodes SNL and SNR and controlled by a signal SHORT. The transistor TN3 equalizes the sense nodes SNL and SNR to each other by generating a short-circuit between the sense nodes SNL and SNR before the data read or write operation.

The n-type transistor TN4 is connected between a DQ line and the sense node SNL, and the n-type transistor TN5 is connected between a BDQ line and the sense node SNR. Gates of the transistors TN4 and TN5 are connected to a column selection line CSLi (hereinafter, also "CSL"). The DQ line and the BDQ line are connected to a DQ buffer (not shown). The DQ buffer, which is connected to an I/O pad, temporarily stores therein the data from the memory cell MC to output the data to the outside during the data read operation, and temporarily stores therein the data from the outside to transmit the data to the sense amplifier S/A during the data write operation. Therefore, the column selection line CSL is activated when the data is read to the outside or when the data is written from the outside, thereby making it possible to connect the sense nodes SNL and SNR to the DQ buffer. During the refresh operation, the column selection line CSL is kept inactive.

FIGS. 5A and 5B are circuit diagrams of the DWLL counters 10 and 11, respectively. The DWLL counter includes a NAND gate NGL1 and counters CTRLi. The NAND gate NGL1 receives a row active signal RACT and a row address signal BA8R, and performs a NAND operation between the signals RACT and BA8R. Each counter CTRLi receives an output signal from the NAND gate NGL1 and an inverted signal of the output signal. The counter CTRLi increments the number of times of activating the dummy word line DWLL whenever both the row active signal RACT and the row address signal BA8R are active (HIGH).

The counter CTRLi counts the number of times of activation using binary values, and the total number of counters CTRLi is eight (i=0 to 7). The DWLL counter can count the number of times of activation by as much as eight bits (00000000 to 11111111) using the binary values. Namely, the counter CTRLi outputs the signals CPLCTUP and BCPLCTUP when the number of times of counting the dummy word line DWLL reaches 256.

The DWLR counter includes a NAND gate NGR1 and counter CTRRi. The NAND gate NGR1 receives the row active signal RACT and a row address signal A8R, and performs a NAND operation between the signals RACT and A8R. Each counter CTRRi receives an output signal from the NAND gate NGR1 and an inverted signal of the output signal. The counter CTRRi increments the number of times of activating the dummy word line DWLR whenever both the row active signal RACT and the row address signal A8R are active (HIGH). The DWLR counter can count the number of times of activation by as much as eight bits using the binary values. Namely, the counter CTRRi outputs the signals CPRCTUP and BCPRCTUP when the number of times of counting the dummy word line DWLL reaches 256.

The relationship between the number of times of activation of the dummy word line DWL and the charge pumping phenomenon will be explained. It is assumed, for example, that a density $N_{it}$ of an interface state between a silicon and a silicon oxide film is about $1 \times 10^{10}$ cm$^{-2}$ ($N_{it}$=about $1 \times 10^{10}$ cm$^{-2}$), and that a ratio of a gate width (W)/a gate length (L) of the dummy cell DC is 0.1 µm/0.1 µm (W/L=0.1/0.1 µm). In this case, an area of an interface between the body region and the gate insulating film is about $1.0 \times 10^{-10}$ cm$^{-2}$ per dummy cell DC, and the number of interface states per dummy cell DC is about one on average. Accordingly, the number of holes disappearing in the dummy cell DC by activating the dummy word line DWL once is about one.

In the FBC memory device, the difference between the data "1" and the data "0" in the number of holes is about 1,000. Therefore, if the number of times of activation of the dummy word line DWL reaches about 1,000, the data "1" is completely changed to the data "0" according to the calculation. Actually, when the number of times of activation of the dummy word line DWL reaches about 500, the probability that the data "0" is erroneously detected as the data "1" increases. It is considered that if the number of times of activation of the dummy word line DWL exceeds 200 to 500, it is substantially necessary to refresh all the dummy cells DC connected to the dummy word line DWL. In the present embodiment, therefore, a temporary refresh operation is performed on the dummy cell DC when the number of times of activation of the dummy word line DWL exceeds 256. If so, it is possible to suppress the data "1" from being changed to the data "0" by the charge pumping phenomenon. The temporary refresh operation is performed when the number of times of activation of the dummy word line DWL exceeds 256 before execution of a regular refresh operation.

A signal DCREF is a dummy refresh signal that is activated when the dummy cell DC is regularly refreshed. If the dummy cell DC is refreshed by the regular refresh operation, holes are supplied by as much as the holes that disappeared by the charge pumping phenomenon. Therefore, when the signal DCREF is active, all the counters CTRLi and CTRRi are reset to zero.

Figure 6:
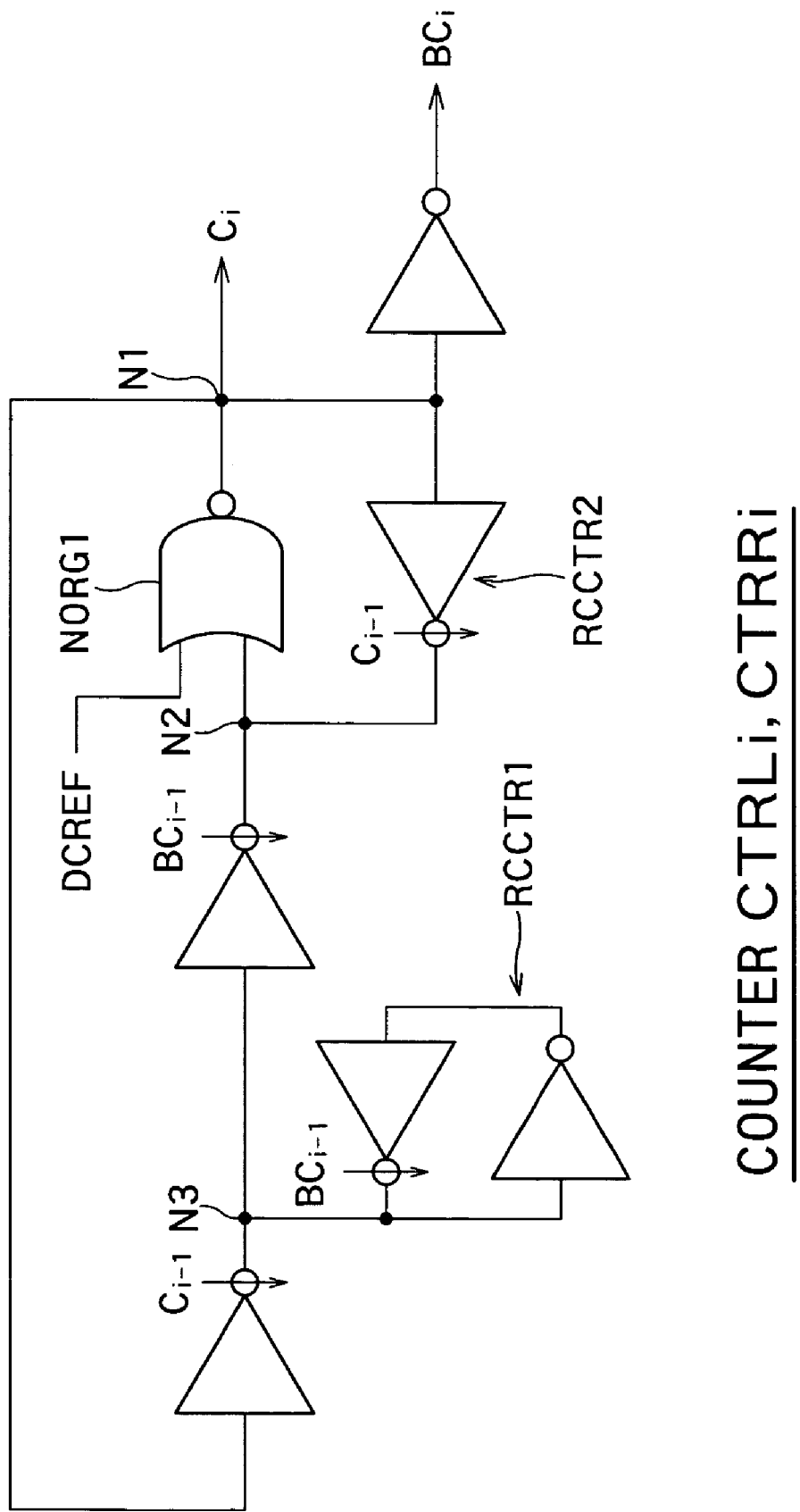
FIG. 6 is a circuit diagram of an internal configuration of the counters CTRLi and CTRRi.

FIG. 6 is a circuit diagram of an internal configuration of the counters CTRLi and CTRRi. Each of the counters CTRLi and CTRRi includes latch circuits RCCTR1 and RCCTR2. The latch circuit RCCTR2 holds signals at nodes N1 and N2. The signal at the node N1 is opposite in polarity to the signal at the node N2. The latch circuit RCCTR1 latches a signal at a node N3.

An inverted signal of the signal at the node N1 is transmitted to the node N3 whenever an output C(i−1) from the counter CTRL(i−1) or CTRR(i−1) in front of the counter CTRLi or CTRRi or an output CO from the NAND gate NGL1 or NGR1 is active (whenever a carry is generated). The latch circuit RCCTR2 latches the signals at the nodes N1 and N2. Next, when the output C(i−1) from the counter CTRL(i−1) or CTRR(i−1) in front of the counter CTRLi or CTRRi or the output C0 from the NAND gate NGL1 or NGR1 becomes inactive, the signal output to the node N3 is latched and an inverted signal of the latched signal is transmitted. If the dummy cell refresh signal DCREF is inactive (low), a NOR gate NORG1 outputs an inverted signal of the signal at the node N2 to the node N1. The signals at the nodes N1 and N2 are latched by the latch circuit RCCTR2. Namely, when "1" is output from the counter CTRL(i−1) or CTRR(i−1), the signal at the node N3 is inverted. Next, when "0" is output from the counter CTRL(i−1) or CTRR(i−1), the signal at the node N1 is transmitted to the node N1 and output to the counter CTRL(i+1) or CTRR(i+1) as Ci. The DWLL counter and the DWLR counter can count the number of times of activation of the dummy word lines DWLL and DWLR using the binary values, respectively.

Figure 7A:
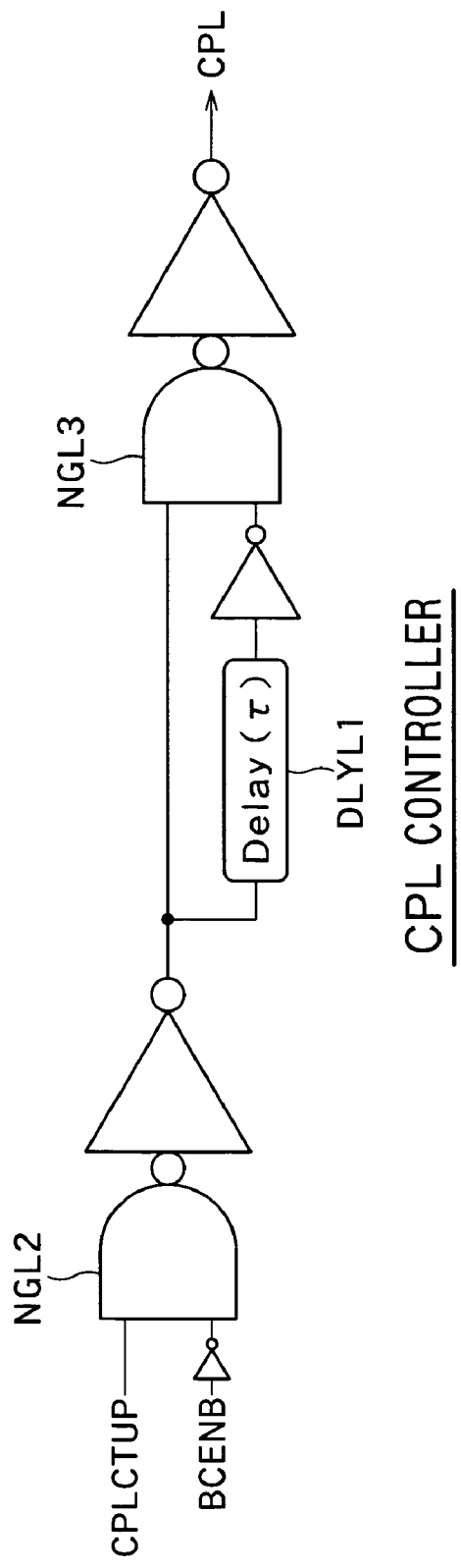
FIG. 7A is a circuit diagram of an internal configuration of the CPL&CPR controller.
Figure 7B:
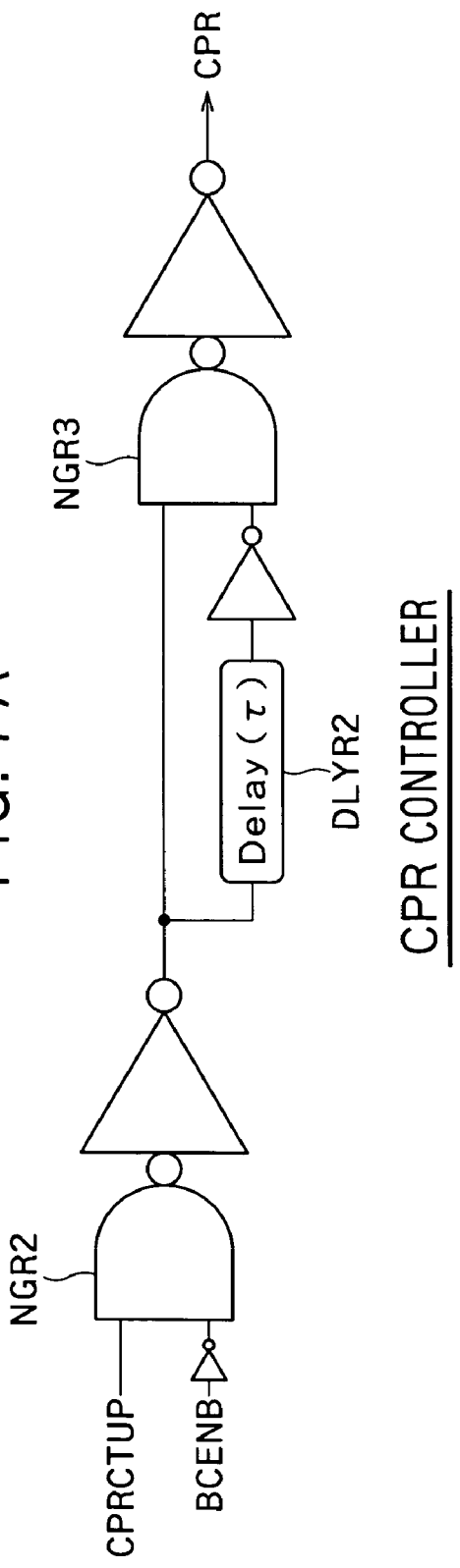
FIG. 7B is a circuit diagram of an internal configuration of the CPL&CPR controller.

FIGS. 7A and 7B are circuit diagrams of an internal configuration of the CPL&CPR controller. FIG. 7A shows a CPL controller in the CPL&CPR controller and FIG. 7B shows a CPR controller in the CPL&CPR controller.

The CPL controller includes NAND gates NGL2 and NGL3 and a delay circuit DLYL1. The NAND gate NGL2 receives the signal CPLCTUP and an inverted signal of the signal BCENB, and outputs a result of a NAND operation between the signal CPLCTUP and the inverted signal of the signal BCENB. The NAND gate NGL3 receives an inverted signal of a signal obtained by delaying an output signal from the NAND gate NGL2 and the output signal from the NAND gate NGL2, and outputs a result of a NAND operation between the inverted signal and the output signal from the NAND gate NGL2. The signal CPL is an inverted signal of an output signal from the NAND gate NGL3. The delay circuit DLYL1 delays the output signal from the NAND gate NGL2 and transmits the resultant delay signal to the NAND gate NGL3.

When the number of times of activation of the dummy word line DWL reaches 256, the signal CPLCTUP becomes active (HIGH). The signal CPLCTUP is passed through the NAND gate NGL2 at timing at which the signal BCENB turns active (LOW), and transmitted to the NAND gate NGL3. At this moment, one of inputs of the NAND gate NGL3 receives the inverted signal of the signal CPLCTUP at delayed timing from timing at which the other input of the NAND gate NGL3 receives the signal CPLCTUP. Due to this, the two inputs of the NAND gate NGL3 are kept high for a predetermined period. As a result, the CPL controller outputs a HIGH pulse as the signal CPL. The HIGH shot pulse is transmitted to the memory cell array MCAL. The signal CPL serves as a trigger for the temporary refresh operation performed on the dummy cell CD in the memory cell array MCAL.

The CPR controller includes NAND gates NGR2 and NGR3 and a delay circuit DLYR1. The NAND gate NGR2 receives the signal CPRCTUP and an inverted signal of the signal BCENB, and outputs a result of a NAND operation between the signal CPRCTUP and the inverted signal. The NAND gate NGR3 receives an inverted signal of a signal obtained by delaying the output signal from the NAND gate NGR2 and the output signal from the NAND gate NGR2, and outputs a result of a NAND operation between the inverted signal and the output signal from the NAND gate NGR2. The signal CPR is an inverted signal of an output signal from the NAND gate NGR3. The delay circuit DLYR1 delays the output signal from the NAND gate NGL2 and transmits the resultant signal to the NAND gate NGR3. The CPR controller operates similarly to the CPL controller, and outputs the signal CPR serving as a trigger for the temporary refresh operation performed on the dummy cell CD in the memory cell array MCAR.

Figure 8:
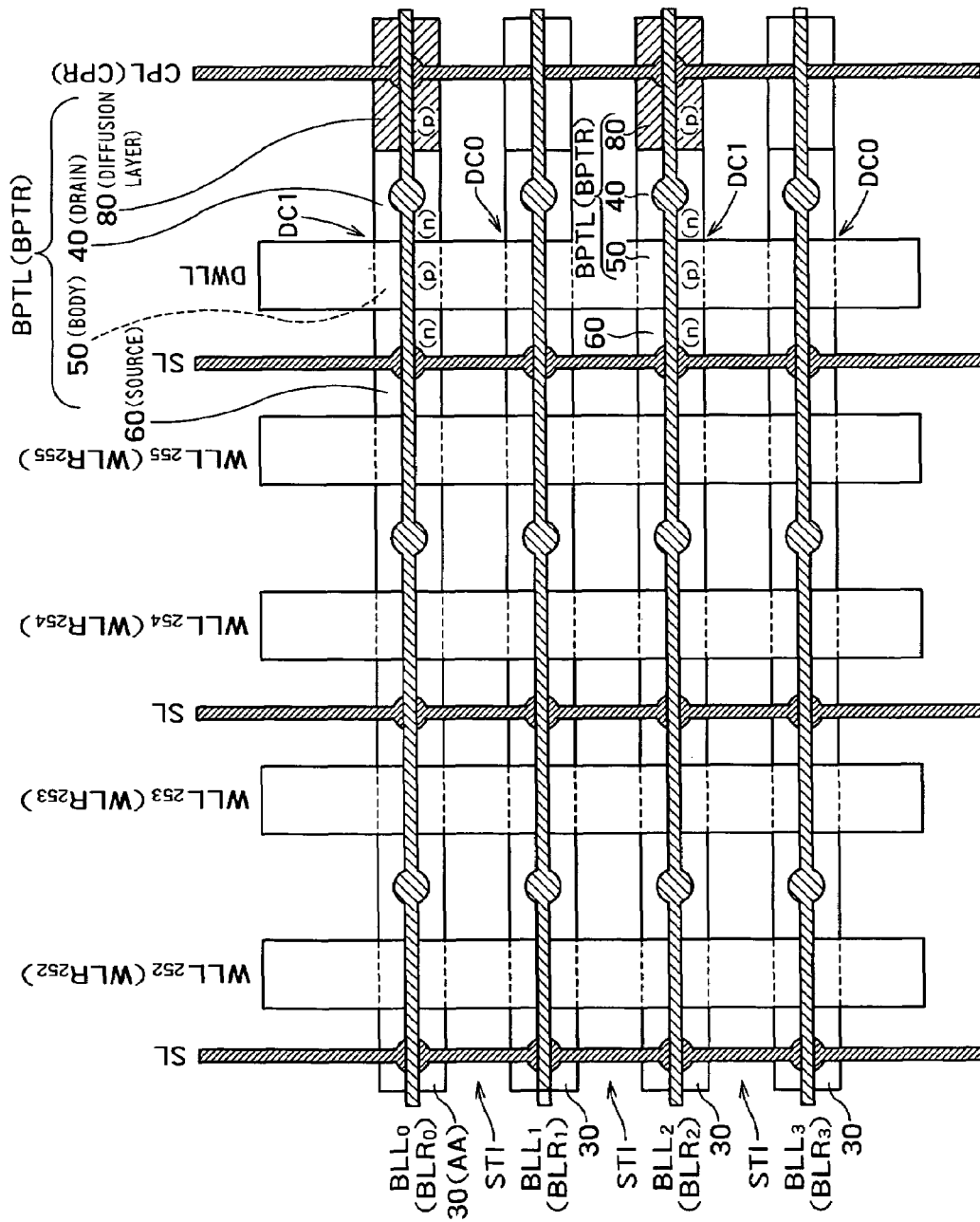
FIG. 8 is a plan view of configurations of the dummy word line DWLL and the bipolar transistor BPTL.

FIG. 8 is a plan view of configurations of the dummy word line DWLL and the bipolar transistor BPTL. STI regions are formed into a stripe on the SOI layer 30. Active areas AA are thereby formed into a stripe. The dummy cells DC and the dummy word lines DWL are provided on a sense-amplifier-side end of the memory cell array MCAL. However, the dummy cells DC and the dummy word lines DWL may be provided on an opposite end of the memory cell array MCAL to the sense-amplifier-side thereof. The p-type CP diffused layer 80 is provided in the active area AA to be adjacent to the drain 40 of the dummy cell DC1. By so providing, the p-type floating body 50 of the dummy cell DC1, the n-type drain 40 of the dummy cell DC1, and the p-type CP diffused layer 80 constitute the bipolar transistor BPTL.

The CP diffused layer 80 is not provided for the dummy cell DC0, so that no bipolar transistor is formed for the dummy cell DC0. Therefore, if the data "1" and the data "0" are alternately stored in the dummy cells DC along the dummy word line DWL, the CP diffused layers 80 are provided for every other dummy cell DC along the dummy word line DWL. The signal line CPL against the charge pumping phenomenon is provided on the CP diffused layers 80 along the dummy word line DWL.

Figure 9:
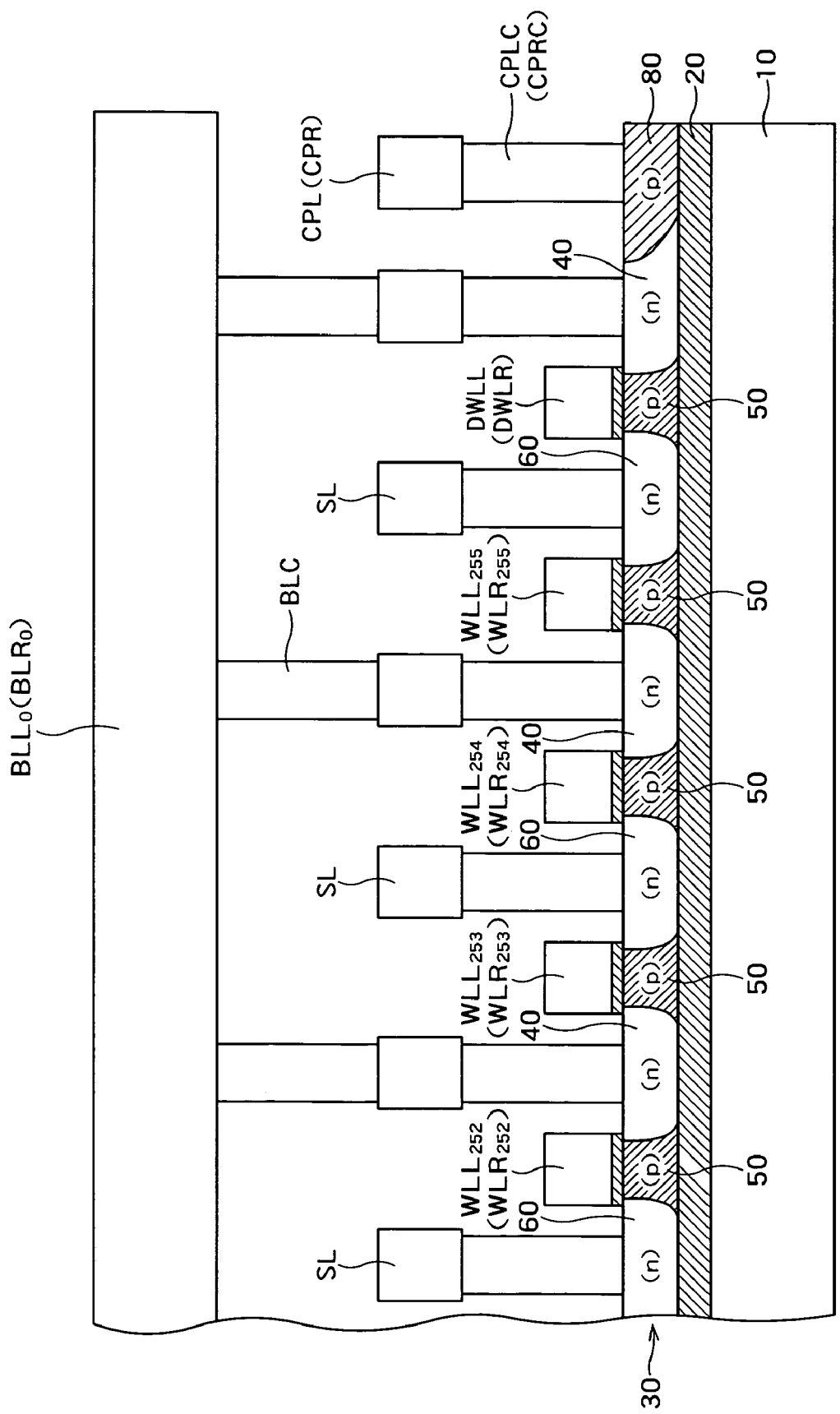
FIG. 9 is a cross-sectional view taken along the bit line BLL0 of FIG. 8.

FIG. 9 is a cross-sectional view taken along the bit line BLL0 of FIG. 8. The CP diffused layer 80 is provided in the SOI layer 30 so as to be adjacent to the drain 40. Furthermore, the floating body 50, the drain 40, and the CP diffused layer 80 located below the dummy word line DWLL constitute a pnp bipolar transistor. The CP diffused layer 80 is connected to the CPL signal line through a CPL contact CPLC. The bit line BL is connected to the drain 40 through a bit-line contact BLC, and a source line SL is connected to the source 60 through a source-line contact SLC.

The CP diffused layer 80 and the signal line CPR against the charge pumping phenomenon are similarly provided on the memory cell array MCAR-side. In this case, the CPL, the DWLL, and WLL shown in FIGS. 8 and 9 are replaced by the CPR, DWLR, and WLR, respectively.

Figure 10:
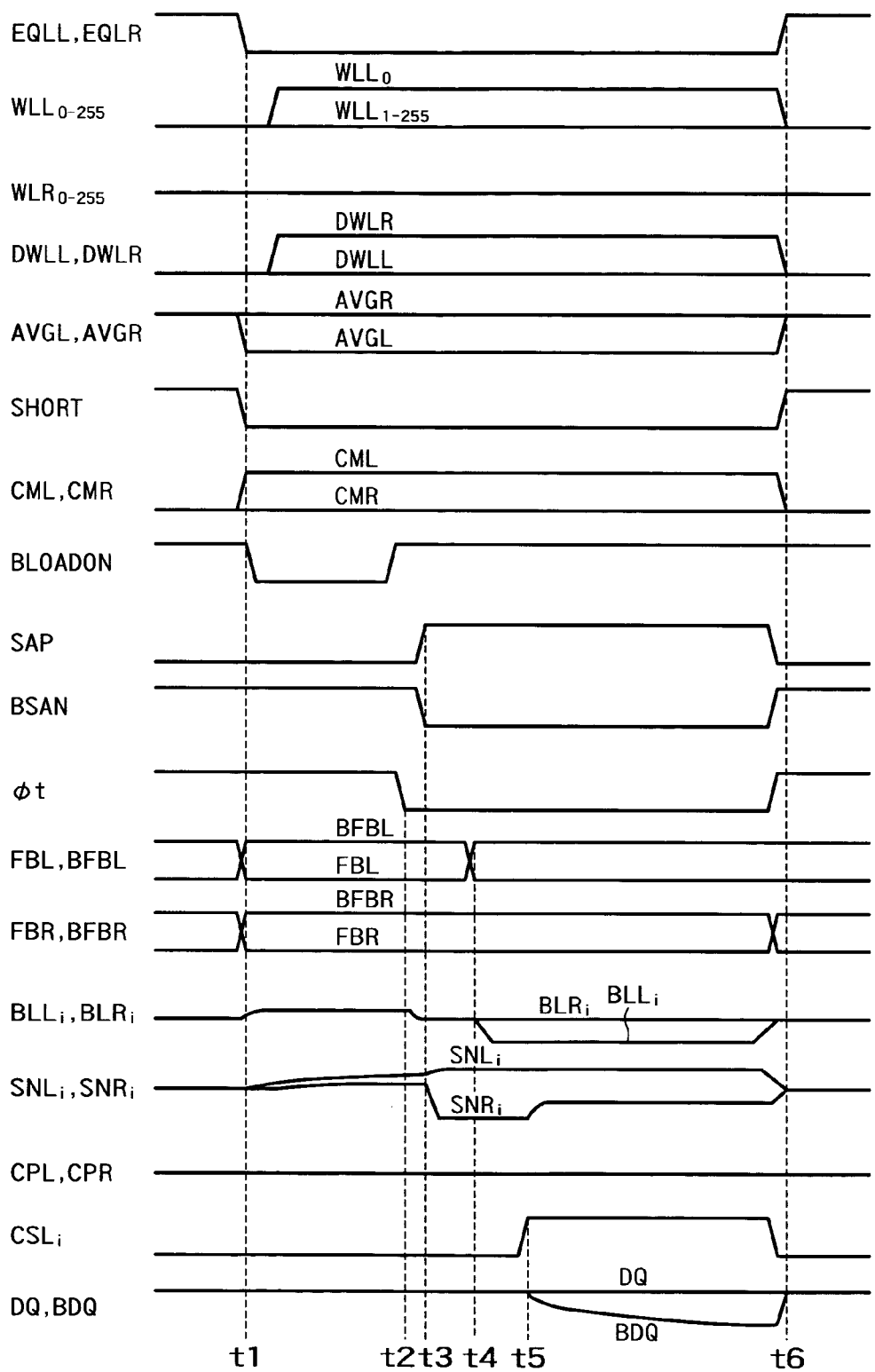
FIG. 10 is a timing chart of an operation of reading data from the memory cell MC to the outside.

FIG. 10 is a timing chart of an operation of reading data from the memory cell MC to the outside. During the data read operation, the sense nodes SNL and SNR shown in FIG. 4 are connected to the bit lines BLL and BLR through the transfer gates TGL1 and TGR1, respectively. The transfer gates TGL2 and TGR2 are turned off, and the bit lines BLL and BLR are not connected to the sense nodes SNL and SNR, respectively.

In the present embodiment, it is assumed that the word line WLL0 is activated. It is also assumed that the sense amplifier S/A receives data from the bit line BLL and the reference potential Vref from the bit line BLR. Namely, the sense amplifier S/A is connected to the memory cell MC through the bit line BLL and to the dummy cell DC through the bit line BLR. The sense amplifier S/A, therefore, detects the data of the memory cell MC connected to the bit line BLL.

At a time t1, the equalizing transistors TEQL and TEQR shown in FIG. 2 are closed by setting the signals EQLL and EQLR low. As a result, the bit lines BLLi and BLRi short-circuited to the ground (VSL) are all turned into high impedance states. At the same time, the paired sense nodes SNLi and SNRi are disconnected from each other by setting the signal SHORT low. Furthermore, at the time t1, the averaging transistor TAVL shown in FIG. 2 is turned off by setting the signal AVGL low. The bit lines BLLi in the memory cell array MCAL are thereby separated from one another. On the other hand, the signal AVGR is kept high, so that the averaging transistor TAVR is turned on. Therefore, the bit lines BLRi in the memory cell array MCAR are kept connected to one another.

Moreover, at the time t1, the signal CML turns HIGH, so that the transistor TP7 is turned off. The signal MPR is kept LOW, so that the transistor TP8 is turned on and the sense node SNRi is connected to a gate of the transistor TP6.

The signals FBL and FBR are set low, so that the transfer gates TGL2 and TGR2 are turned off. Accordingly, the bit line BLLi is disconnected from the sense node SNRi, and the bit line BLRi is disconnected from the sense node SNLi. However, because the signal Φt is high, the bit line BLLi is kept connected to the sense node SNLi and the bit line BLRi is kept connected to the sense node SNRi.

Right after the time t1, the signal BLOADON is set LOW, the current mirror applies the same current Iref to the memory cell MC and the dummy cell DC from the power supply VBLH through the sense nodes SNLi and SNRi and the bit lines BLLi and BLRi. The current generates a potential difference (signal difference) between the paired sense nodes SNLi and SNRi.

When the signal difference exceeds a predetermined value at a time t2, the signal Φt is set low. As a result, the bit lines BLLi and BLRi are disconnected from the sense nodes SNLi and SNRi.

At a time t3, the signals SAP and BSAN are activated. In response to the activation of the signals SAP and BSAN, the latch circuits RC1 and RC2 amplify the signals transmitted to the sense nodes SNLi and SNRi, and latch a potential between the power supply potentials VBLH and VBLL. The potential VBLL is a bit line potential at a low level necessary to write the data "0" to the memory cell MC.

At a time t4, the signal FBL is activated and set HIGH, and the transfer gate TGL2 is turned on. As a result, the data read from the time t1 to the time t3 and latched by the latch circuits RC1 and RC2 is restored to the memory cell MC through the bit line BLLi.

At a time t5, the column signal CSLi is activated and set HIGH. Accordingly, the transistors TN4 and TN5 shown in FIG. 4 are turned on, and the sense nodes SNLi and SNRi are short-circuited to the DQ line and the BDQ line, respectively. Because the DQ line and the BDQ line are precharged at high level, the charges are gradually emitted from the DQ line or the BDQ line by the short-circuit with the sense node SNLi or SNRi. As a result, the data is transmitted to the DQ buffer. Moreover, the data is output to the outside through the I/O pad connected to the DQ buffer.

At a time t6, the FBC memory device returns to a precharge state. It is to be noted that the number of times of activation of the dummy word line DWL counted by the DWLR counter does not reach 256 in the data read operation. For this reason, the signals CPL and CPR are kept low (VBLL), so that the pnp bipolar transistor BPTL is not turned on.

Figure 11:
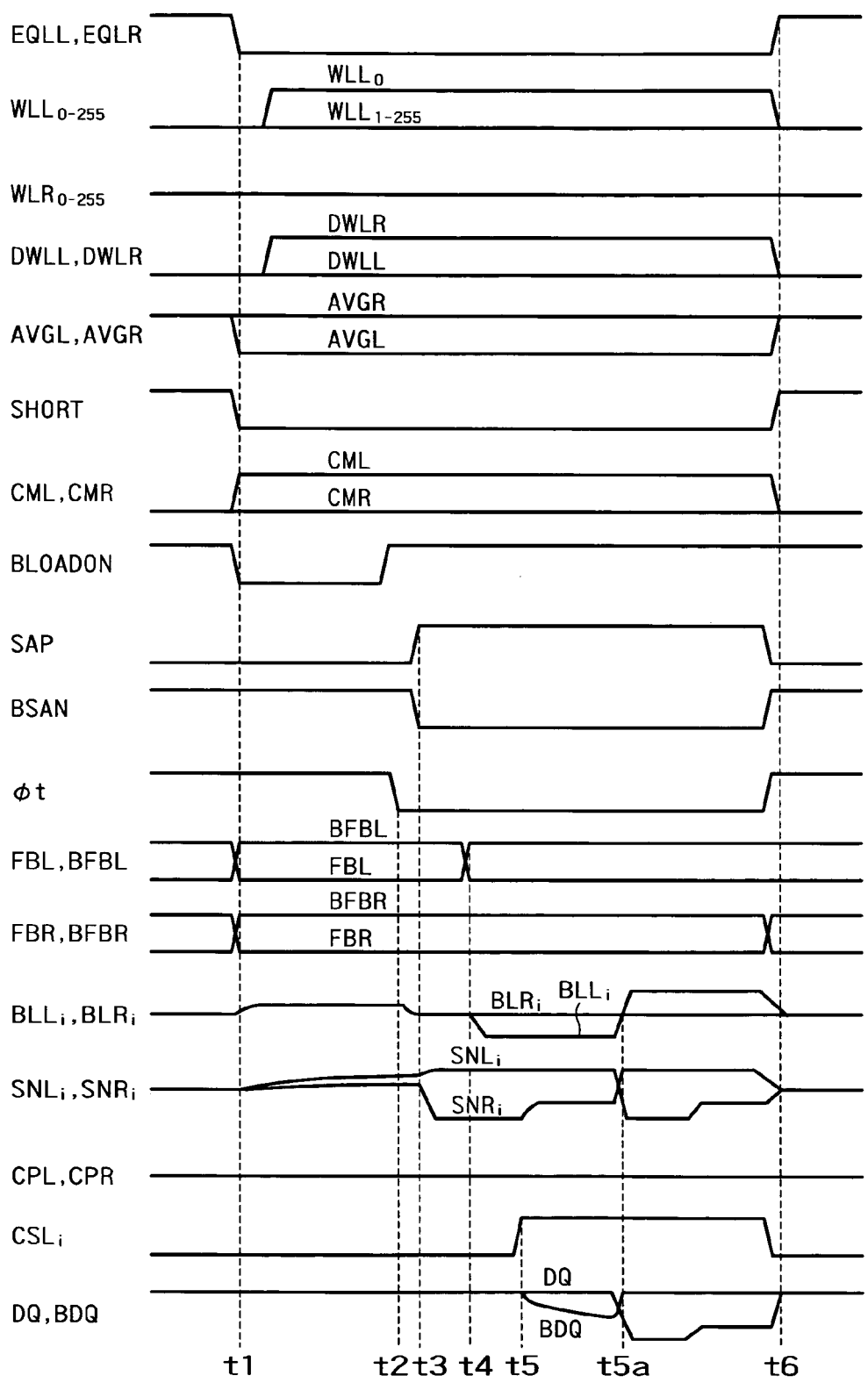
FIG. 11 is a timing chart of an operation of writing data from the outside to the memory cell MC.

FIG. 11 is a timing chart of an operation of writing data from the outside to the memory cell MC. During the data write operation, the sense node SNR is connected to the bit line BLL through the transfer gate TGL2, and the data is thereby written to the memory cell MC. The sense node SNL is connected to the bit line BLR through the transfer gate TGR1, and the data is thereby written to the memory cell MC. During the data write operation, the transfer gates TGL1 and TGR1 are turned off, and the bit lines BLL and BLR are not connected to the sense nodes SNR and SNL, respectively.

The data write operation is performed similarly to the data read operation from the time t1 to the time t5. In the data write operation differently from the data read operation, at a time t5a after the time t5, data opposite in polarity to the read data is transmitted from the outside to the DQ line and the BDQ line. As a result, data polarities of the sense nodes SNLi and SNRi and the bit lines BLLi and BLRi are inverted, so that the data opposite in polarity to the data that has been stored in the memory cell MC can be written to the memory cell MC. It is to be noted that the number of times of activation of the dummy word line DWL counted by the DWLR counter does not reach 256 in the data write operation similarly to the data read operation. For this reason, the signals CPL and CPR are kept low (VBLL), so that the pnp bipolar transistor BPTL is not turned on.

Figure 12:
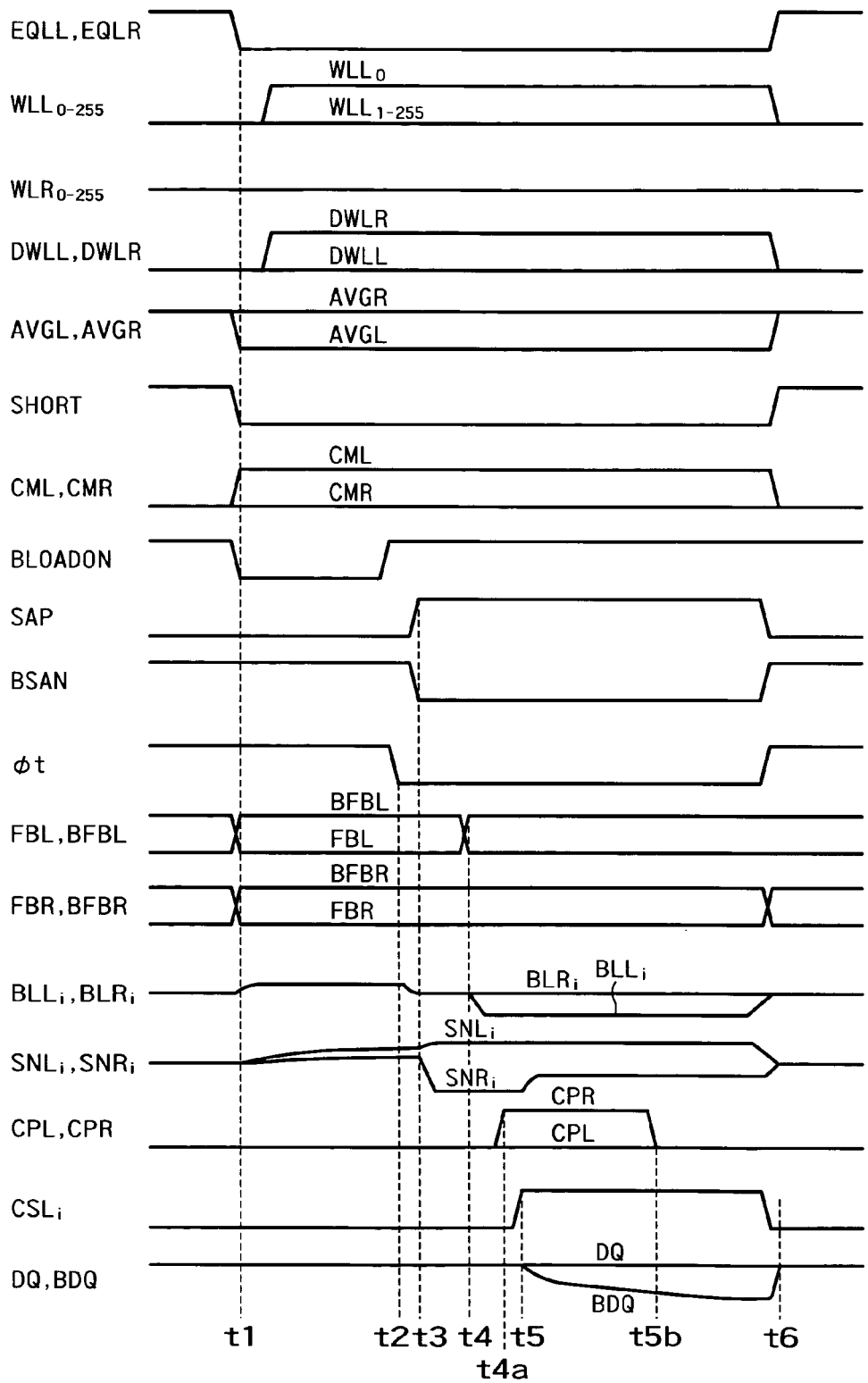
FIG. 12 is a timing chart of the temporary refresh operation performed on the dummy cell DC.

FIG. 12 is a timing chart of the temporary refresh operation performed on the dummy cell DC. The temporary refresh operation is performed in a cycle of the data read operation when the number of times of activation of the dummy word line DWLR reaches 256. Because FIG. 12 shows the operation of reading data from the memory cell array MCAL, the temporary refresh operation is performed on the dummy cell DC in the memory cell array MCAR. The temporary refresh operation is performed on the dummy cell DC in the memory cell array MCAL during the operation of reading the data from the memory cell array MCAR.

The data read operation is basically the same as that shown in FIG. 10. However, differently from FIG. 10, at a time t4a, the signal CPR against the charge pumping phenomenon is activated and set as HIGH to perform the temporary refresh operation. As a result, a high-level potential is applied to the CP diffused layer 80 through the CPR signal line. At this moment, the dummy word line DWLR is active. When the high-level potential is applied to the CP diffused layer 80, the pn junction between the CP diffused layer 80 and the drain 40 is biased in the forward direction and the holes are injected into the drain 40. Parts of the holes are diffused up to the floating body 50 of the dummy cell DC without being recombined with electrons in the drain 40. That is, the pnp bipolar transistor BPTL is turned on. As a result, holes are injected into the floating body 50 by as much as the holes that disappeared by the charge pumping phenomenon.

FIG. 13A is a timing chart of the signals BCENB, CPLCTUP, and CPL input or output to or from the CPL controller shown in FIG. 7A during the temporary refresh operation performed on the dummy cell DC. FIG. 13B is a timing chart of the signals BCENB, CPRCTUP, and CPR input or output to or from the CPR controller shown in FIG. 7B during the temporary refresh operation performed on the dummy cell DC. It is assumed that the temporary refresh operation is performed on the dummy cell DC in the memory cell array MCAR similarly to the operation shown in FIG. 12. The temporary refresh operation will be, therefore, explained with reference to FIG. 13B.

At the time t1, the row active signal BRAS is activated and set LOW, and the precharging is finished, accordingly. One of the word lines and the dummy word lines DWL can be, therefore, selected. Thereafter, the data read from the memory cell MC is latched by the latch circuits RC1 and RC2. At this moment, if the number of times of activation of the dummy word line DWLR reaches 256, the DWLR counter sets the signal CPRCTUP active (HIGH). It is to be noted, however, the CPR controller shown in FIG. 7B does not set the signal CPR active (HIGH) at this moment because the signal BCENB is inactive (HIGH).

At the time t4a, the column enable signal BCENB is activated and set LOW. The signal BCENB is the column enable signal that permits activation of the column selection line CSL corresponding to one of the bit lines BL after the word line BLL and the dummy word line DWLR rise. The signal BCENB is activated after the data is latched and the feedback signals FBL and BFBL are activated. At timing at which the signal BCENB is activated, the CPR controller shown in FIG. 7B sets the signal line CPR active (HIGH). As a result, the temporary refresh operation is performed on the dummy cell DC.

At a time t5b, the CPR controller sets the CPR signal line LOW. As a result, the temporary refresh operation performed on the dummy cell DC is finished. In other words, the CPR controller applies a voltage to the CP diffused layer 80 for a predetermined term from the time when one of bit lines BL is selected by the column selection line CSL. An end of the refresh operation is decided by the delay circuit DLYR1 shown in FIG. 7B. A refresh period from the time t4a to the time t5b can be arbitrarily decided by changing a setting of the delay time for the delay circuit DLYR1 shown in FIG. 7B. Furthermore, by using the delay circuit DLYR1, the temporary refresh operation performed on the dummy cell DC can be automatically finished.

According to the present embodiment, it is possible to deal with the charge pumping phenomenon only by providing the CP diffused layer 80 adjacent to the dummy cell DC1, and it is unnecessary to an FET dedicated to the charge pumping phenomenon. It is, therefore, possible to reduce the chip size of the overall FBC memory device.

Moreover, according to the present embodiment, the holes are supplied by the operation of the bipolar transistor. It is, therefore, possible to reduce power consumption and accelerate operation as compared with the method of supplying holes by the impact ionization.

Modification of First Embodiment

In the first embodiment, the temporary refresh operation is performed on the dummy cell during the data read operation. In a modification of the embodiment, the temporary refresh operation is performed on the dummy cell during the data write operation.

Figure 14:
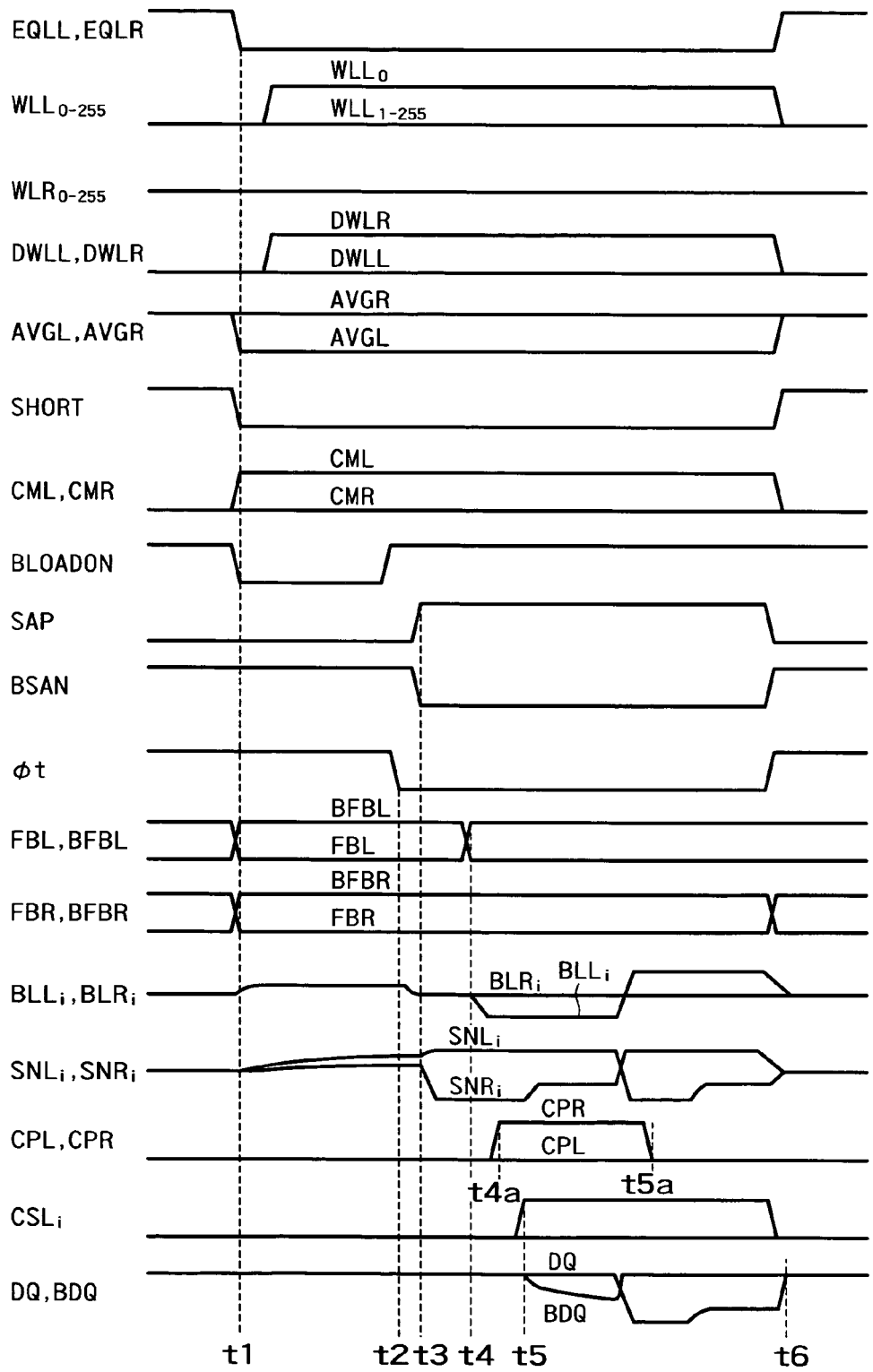
FIG. 14 is a timing chart of the temporary refresh operation performed on the dummy cell DC according to the modification of the first embodiment.

FIG. 14 is a timing chart of the temporary refresh operation performed on the dummy cell DC according to the modification of the first embodiment. In the modification, the signal CPR is activated during the data write operation. Activation timings of the signals BCENB, CPLCTUP, and CPL and those of the signals BCENB, CPRCTUP, and CPR during the temporary refresh operation performed on the dummy cell DC are the same as those shown in FIGS. 13A and 13B, respectively. In this manner, the temporary refresh operation may be performed on the dummy cell DC during the data write operation.

Second Embodiment

Figure 15:
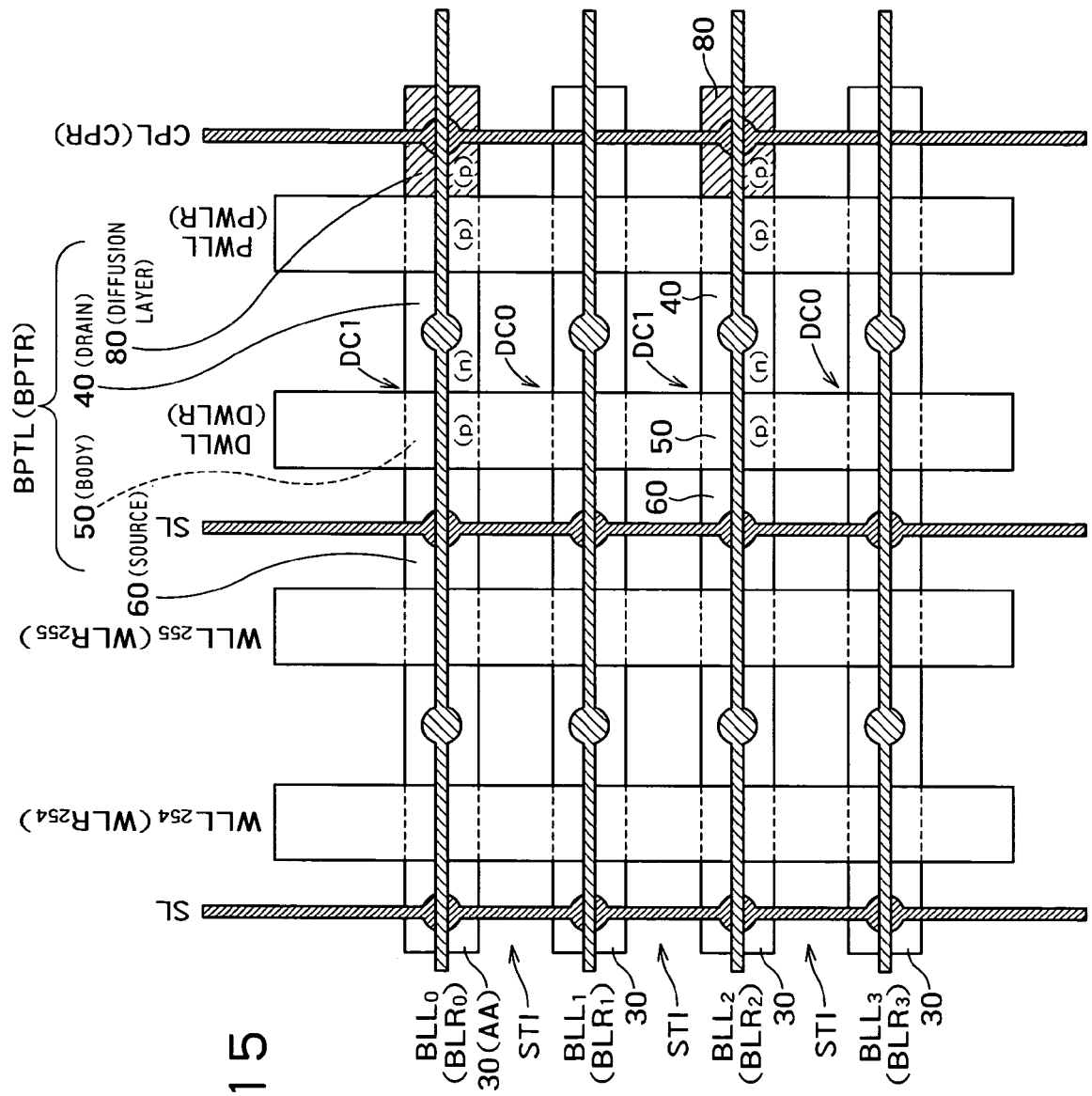
FIG. 15 is a plan view of the dummy cell DC, the dummy word line DWLL, and the bipolar transistor BPTL according to a second embodiment of the present invention.
Figure 16:
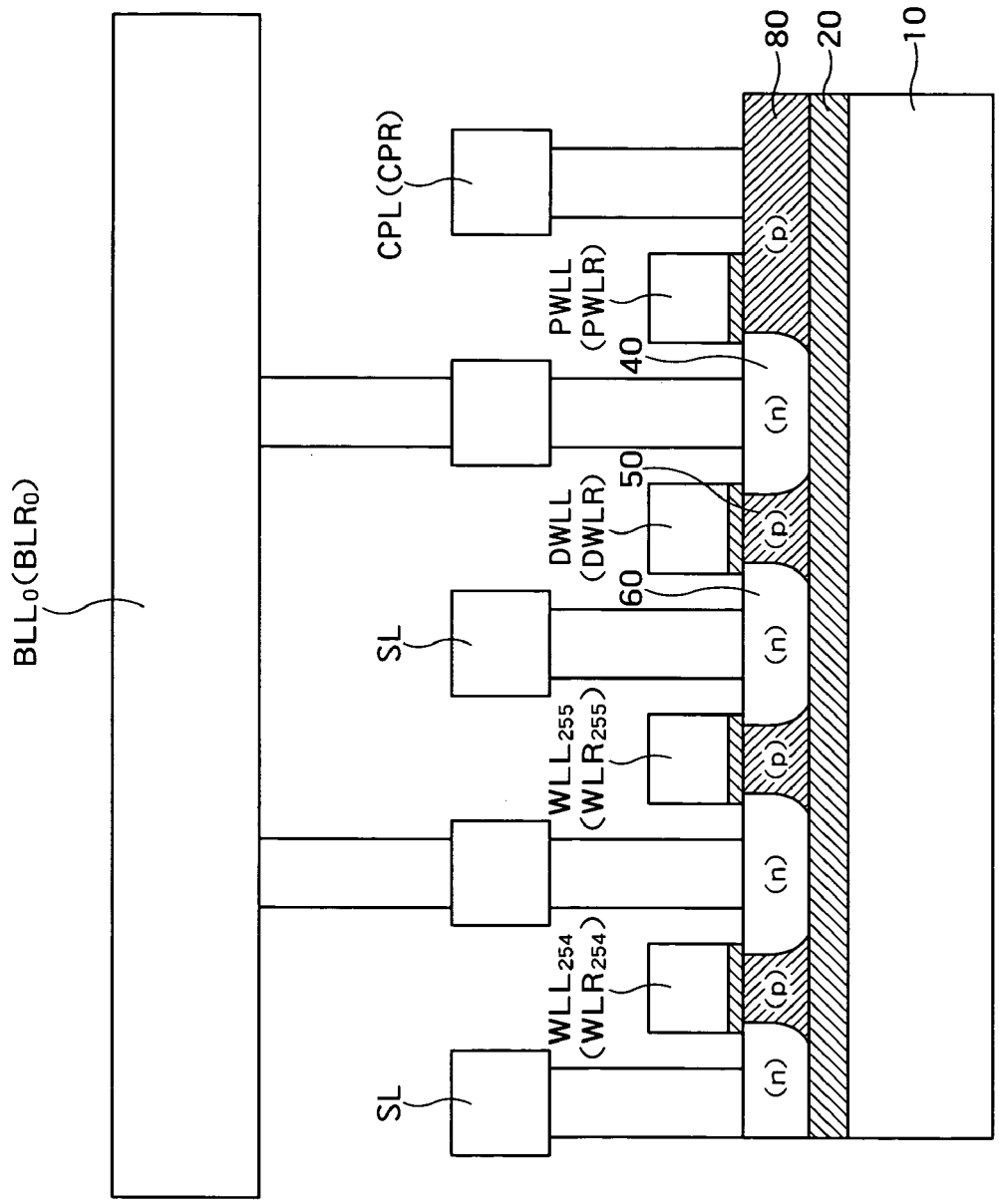
FIG. 16 is a cross-sectional view taken along the bit line BLL0 of FIG. 15.

FIG. 15 is a plan view of the dummy cell DC, the dummy word line DWLL, and the bipolar transistor BPTL according to a second embodiment of the present invention. FIG. 16 is a cross-sectional view taken along the bit line BLLO of FIG. 15. In the second embodiment, the drain 40 on the end of each of the memory cell arrays MCAL and MCAR is replaced by the p-type CP diffused layer 80. Therefore, the floating body 50 on the end of each of the memory cell arrays MCAL and MCAR is connected to the p-type CP diffused layer 80, and functions as an emitter. Pseudo-word lines PWLL and PWLR are provided on ends of the memory cell arrays MCAL and MCAR, respectively. The pseudo-word lines PWLL and PWLR are located between the dummy word lines DWLL and DWLR and the lines CPL and CPR, respectively. Each of the pseudo-word lines PWLL and PWLR is kept to a low potential VWLL for the word line during data holding. However, the present invention is not necessarily limited to this configuration. The other constituent elements of an FBC memory device and the other operations performed by the FBC memory according to the second embodiment may be the same as those according to the first embodiment. In addition, the pseudo-word lines PWLL and PWLR can be set thicker than the word lines WLR and WLL and the dummy word lines DWLL and DWLR.

According to the second embodiment, a width of the drain 40 that functions as a base is decided by the dummy word lines DWLL and DWLR and the pseudo-word lines PWLL and PWLR in a self-aligned fashion. As a result, during the refresh operation performed on the dummy cell DC, it is possible to stabilize the operations performed by the bipolar transistors BPTL and BPTR and ensure supplying holes to the dummy cell DC.

Moreover, according to the second embodiment, the CP diffused layer 80 can be formed at the same step as that of forming the source 60 and the drain 40. It is, therefore, possible to easily deal with formation of a suicide layer on surfaces of the source 60 and the drain 40.

Third Embodiment

Figure 17:
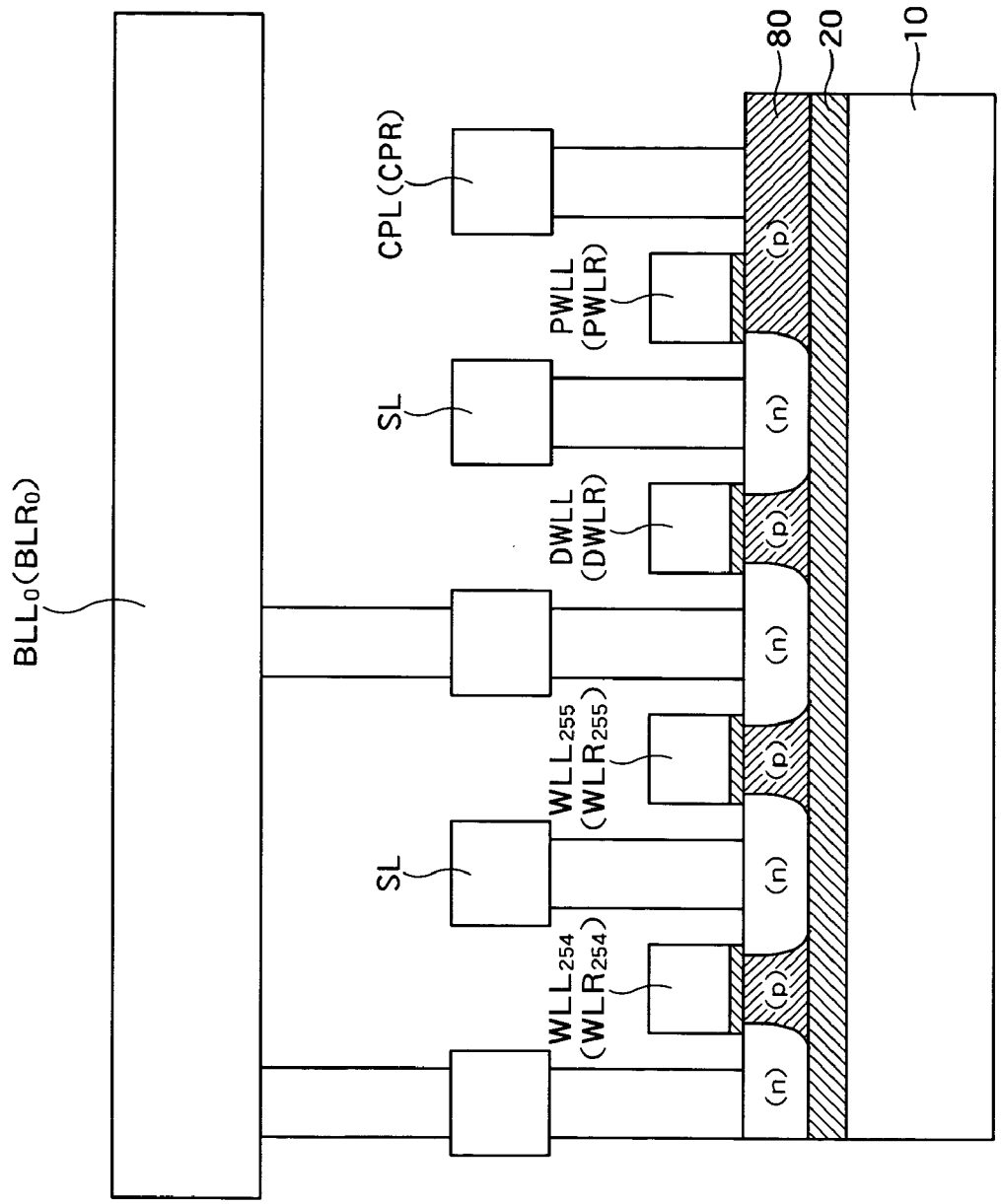
FIG. 17 is a cross-sectional view of configurations of the dummy cell DC, the dummy word line DWLL, and the bipolar transistor BPTL according to a third embodiment of the present invention.

FIG. 17 is a cross-sectional view of configurations of the dummy cell DC, the dummy word line DWLL, and the bipolar transistor BPTL according to a third embodiment of the present invention. In the third embodiment, the positional relationship between the source 60 and the drain 40 is opposite to the positional relationship therebetween in the second embodiment. Other configurations and operations according to the third embodiment can be the same as those according to the second embodiment. The third embodiment can attain the same advantages as those of the second embodiment.

Fourth Embodiment

Figure 18:
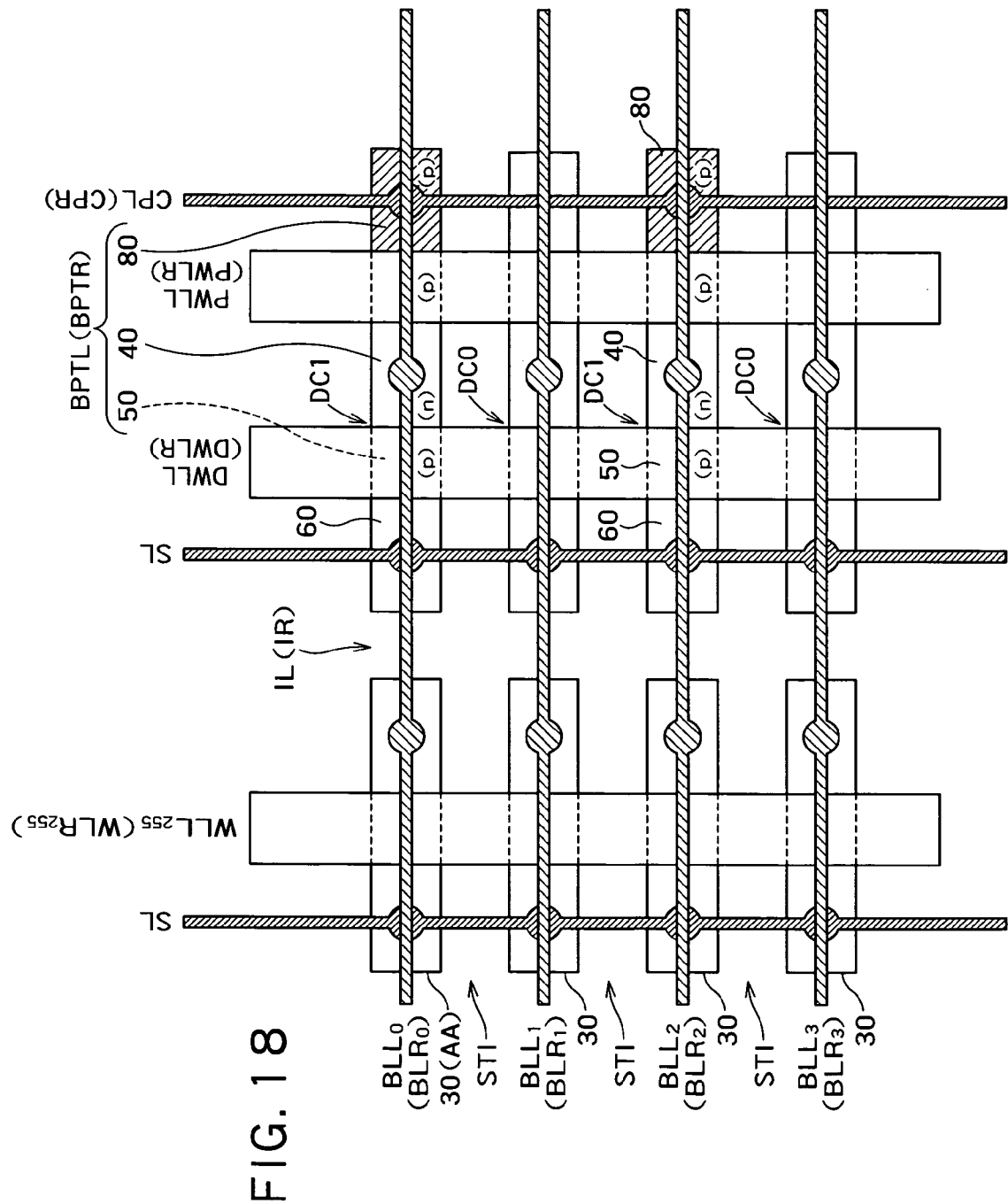
FIG. 18 is a cross-sectional view of configurations of the dummy cell DC, the dummy word line DWLL, and the bipolar transistor BPTL according to a fourth embodiment of the present invention.
Figure 19:
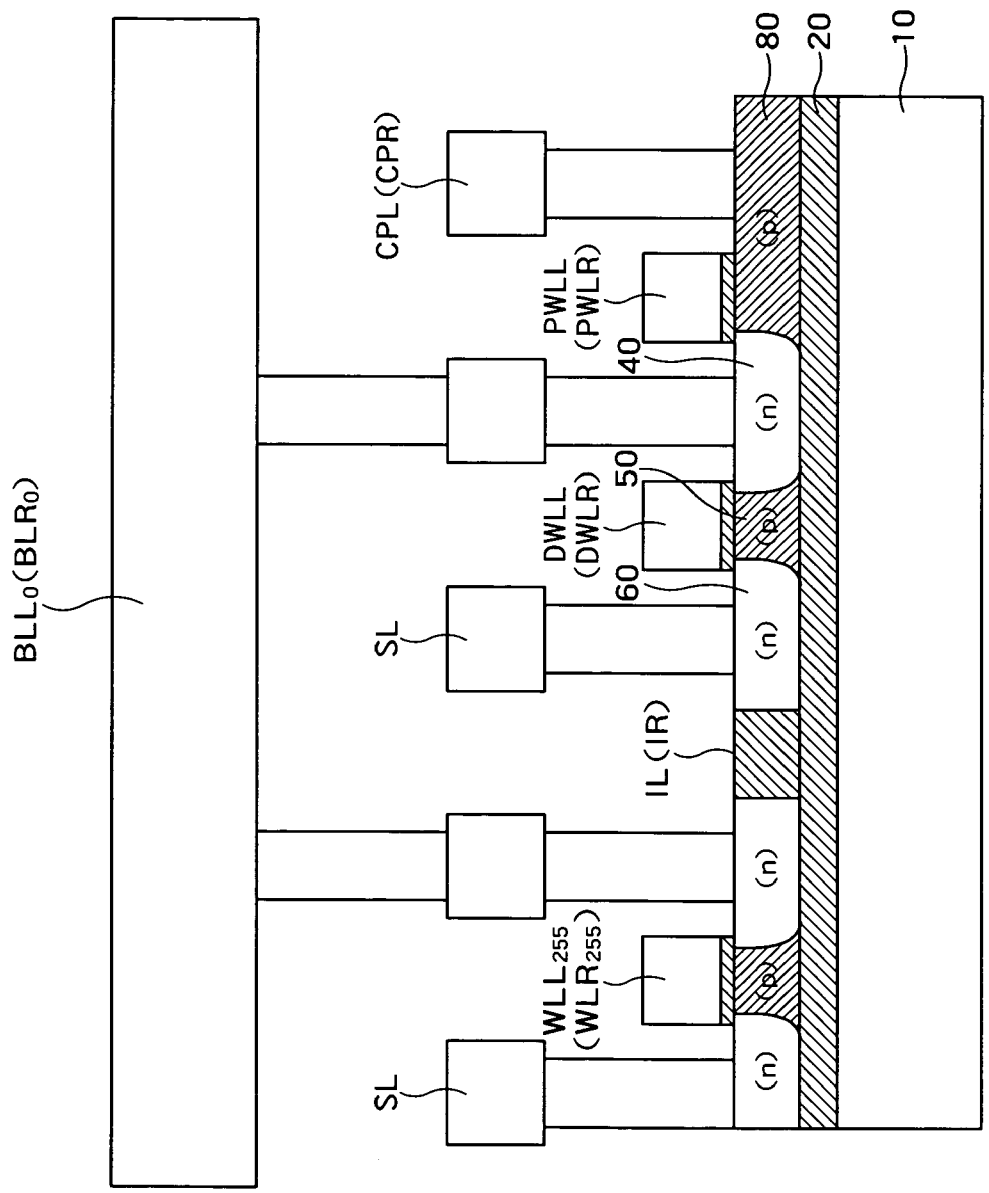
FIG. 19 is a cross-sectional view taken along the bit line BLL0 of FIG. 18.

FIG. 18 is a cross-sectional view of configurations of the dummy cell DC, the dummy word line DWLL, and the bipolar transistor BPTL according to a fourth embodiment of the present invention. FIG. 19 is a cross-sectional view taken along the bit line BLL0 of FIG. 18. An FBC memory device according to the fourth embodiment includes element isolation regions IL and IR between the dummy cell DC and the memory cell MC. Specifically, the element isolation region IL or IR is provided between the source of the dummy cell DC and the drain of the memory cell MC. Other configurations and operations according to the fourth embodiment can be the same as those according to the second embodiment.

According to the fourth embodiment, it is possible to prevent the holes injected from the bipolar transistors BPTL and BPTR from reaching the memory cell MC through the dummy cell DC during the refresh operation performed on the dummy cell DC. Accordingly, in the FBC memory device according to the fourth embodiment, a sufficiently high potential can be applied to the CPL and CPR signal lines, and the bipolar disturbance can be suppressed even if the high potential is applied to the CPL and CPR signal lines. The fourth embodiment can attain the same advantages as those of the second embodiment.

In the fourth embodiment, each of the element isolation regions IL and IR is provided between the dummy cell DC and the memory cell MC. Furthermore, each of the element isolation regions IL and IR is not provided between the adjacent memory cells MC. However, each of the element isolation regions IL and IR can be provided between the adjacent memory cells MC. Moreover, the positional relationship between the source 60 and the drain 40 may be inverted similarly to the third embodiment.

In the first to the fourth embodiments, the temporary refresh operation is performed on the dummy cell DC when the number of times of activation of the dummy word line DWLL or DWLR reaches the predetermined value. However, the refresh operation may be performed whenever the data read operation or data write operation is performed. In this case, the DWLL counter, the DWLR counter, and the CPL&CPR controller can be dispensed with. Therefore, the chip size of the FBC memory device can be further reduced.

However, in the light of a reduction of power consumption, the method according to the first to the fourth embodiments is more advantageous than the method in which the temporary refresh operation is performed whenever the data read or write operation is performed.

The invention claimed is:

1. A semiconductor memory device comprising:
a memory cell including a floating body in an electrically floating state and storing therein data according to a number of a plurality of majority carriers accumulated in the floating body;
a dummy cell generating a reference signal based on which the data stored in the memory cell is detected;
a word line connected to a gate of the memory cell;
a dummy word line connected to a gate of the dummy cell;
a bit line connected to a source or a drain of the memory cell and a source or a drain of the dummy cell;
a diffused layer adjacent to the source or the drain of the dummy cell, the diffused layer being equal in conduction type to the floating body of the dummy cell;
a counter counting a number of times of activating the dummy word line; and
a charge supplying line driving the bipolar transistor by applying a voltage to the diffused layer and supplying the majority carriers to the floating body of the dummy cell when the number of times of activating the dummy word line reaches a predetermined value, wherein
the floating body of the dummy cell, the source or the drain of the dummy cell, and the diffused layer constitute a bipolar transistor.

2. The semiconductor memory device according to claim 1, further comprising an element isolation region electrically isolating the memory cell from the dummy cell.

3. The semiconductor memory device according to claim 1, further comprising:
a controller connected to the bipolar transistor through the charge supplying line and applying a voltage to the diffused layer for a predetermined term from the time when the bit line is selected, in case that a number of times of activation of the dummy word line reaches a predetermined number.

4. The semiconductor memory device according to claim 3, wherein
the controller includes a delay circuit automatically finishing the applying the voltage to the diffused layer after the predetermined term from the time when the bit line is selected.

5. A semiconductor memory device comprising:
a memory cell including a floating body in an electrically floating state and storing therein data according to a number of a plurality of majority carriers accumulated in the floating body;
a dummy cell generating a reference signal based on which the data stored in the memory cell is detected;
a word line connected to a pate of the memory cell;
a dummy word line connected to a pate of the dummy cell;
a bit line connected to a source or a drain of the memory cell and a source or a drain of the dummy cell;
a diffused layer adjacent to the source or the drain of the dummy cell, the diffused aver being equal in conduction type to the floating body of the dummy cell;
a charge supplying line electrically connecting to the diffusion layer; and
a pseudo-word line provided between the charge supplying line and the dummy word line, wherein
the floating body of the dummy cell, the source or the drain of the dummy cell, and the diffused layer constitute a bipolar transistor;
the floating body of the dummy cell functions as a collector,
the source or the drain of the dummy cell functions as a base,
the diffused layer functions as an emitter, and
the charge supplying line drives the bipolar transistor by applying a voltage to the diffused layer, and supplies the majority carriers to the floating body of the dummy cell.

6. The semiconductor memory device according to claim 5, wherein
a width of the source or the drain of the dummy cell functioning as a base in the bipolar transistor is determined in a self-alignment technique by the dummy word line and the pseudo-word line.

7. The semiconductor memory device according to claim 5, further comprising an element isolation region electrically isolating the memory cell from the dummy cell.

8. The semiconductor memory device according to claim 5, further comprising:
   a controller connected to the bipolar transistor through the charge supplying line and applying a voltage to the diffused layer for a predetermined term from the time when the bit line is selected, in case that a number of times of activation of the dummy word line reaches a predetermined number.

9. The semiconductor memory device according to claim 8, wherein
   the controller includes a delay circuit automatically finishing the applying the voltage to the diffused layer after the predetermined term from the time when the bit line is selected.

\* \* \* \* \*